(12) United States Patent
Park

(10) Patent No.: US 12,439,628 B2
(45) Date of Patent: Oct. 7, 2025

(54) TWO-DIMENSIONAL ELECTRON GAS CHARGE DENSITY CONTROL

(71) Applicant: Navitas Semiconductor Limited, Dublin (IE)

(72) Inventor: Pil Sung Park, Redondo Beach, CA (US)

(73) Assignee: Navitas Semiconductor Limited, Dublin (IE)

( * ) Notice: Subject to any disclaimer, the term of this patent is extended or adjusted under 35 U.S.C. 154(b) by 532 days.

(21) Appl. No.: 17/845,756

(22) Filed: Jun. 21, 2022

(65) Prior Publication Data

US 2022/0406927 A1  Dec. 22, 2022

Related U.S. Application Data

(60) Provisional application No. 63/213,655, filed on Jun. 22, 2021.

(51) Int. Cl.
  *H10D 30/47*    (2025.01)
  *H10D 30/01*    (2025.01)
  *H10D 62/85*    (2025.01)

(52) U.S. Cl.
  CPC ......... *H10D 30/475* (2025.01); *H10D 30/015* (2025.01); *H10D 62/8503* (2025.01)

(58) Field of Classification Search
  None
  See application file for complete search history.

(56) References Cited

U.S. PATENT DOCUMENTS

2013/0140578 A1  6/2013  Yu et al.
2019/0096877 A1  3/2019  Kudymov
2019/0326426 A1* 10/2019  Park ............... H10D 30/475
2020/0328296 A1  10/2020  Hwang
2020/0373383 A1  11/2020  Zhang

FOREIGN PATENT DOCUMENTS

CN    112768505 A    5/2021
DE    102016215438 A1    2/2018
TW    202042395 A    11/2020
TW    202121835 A    6/2021

OTHER PUBLICATIONS

TW111123038 , "Office Action", Feb. 14, 2023, 6 pages.
Notice of Allowance from related case, Taiwan Appl. No. 112147838, issued on May 9, 2024, 7 pages.
DE102022115381.9, "Office Action", Apr. 13, 2023, 7 pages.

* cited by examiner

*Primary Examiner* — Anthony Ho

(74) *Attorney, Agent, or Firm* — FisherBroyles, LLP

(57) ABSTRACT

Structures and related techniques for control of two-dimensional electron gas (2DEG) charge density in gallium nitride (GaN) devices are disclosed. In one aspect, a GaN device includes a compound semiconductor substrate, a source region formed in the compound semiconductor substrate, a drain region formed in the compound semiconductor substrate and separated from the source region, a 2DEG layer formed in the compound semiconductor substrate and extending between the source region and the drain region, a gate region formed on the compound semiconductor substrate and positioned between the source region and the drain region, and a plurality of isolated charge control structures disposed between the gate region and the drain region.

19 Claims, 20 Drawing Sheets

TWO-DIMENSIONAL ELECTRON GAS CHARGE DENSITY CONTROL

CROSS-REFERENCE TO RELATED APPLICATION

This present application claims the benefit of U.S. Provisional application No. 63/213,655, filed on Jun. 22, 2021, entitled "TWO-DIMENSIONAL ELECTRON GAS CHARGE DENSITY CONTROL", the entire contents of which is incorporated herein by reference for all purposes.

FIELD

The described embodiments relate generally to compound semiconductor devices, and more particularly, the present embodiments relate to two-dimensional electron gas charge density control in gallium nitride (GaN) devices.

BACKGROUND

In semiconductor technology, gallium nitride (GaN) is one compound semiconductor material that is used to form various devices, such as high power and/or high voltage transistors. These devices can be formed by growing epitaxial layers on silicon, silicon carbide, sapphire, gallium nitride, or other substrates. Often, such devices are formed using a heteroepitaxial junction of aluminum gallium nitride (AlGaN) and GaN. This structure is known to form a high electron mobility two-dimensional electron gas (2DEG) at the interface of the two materials. The electron gas can have a charge density in the 2DEG. In many applications, it may be desirable to control the charge density in the 2DEG.

SUMMARY

In some embodiments, a gallium nitride (GaN) device is disclosed. The GaN device includes a compound semiconductor substrate, a source region formed in the compound semiconductor substrate, a drain region formed in the compound semiconductor substrate and separated from the source region, a two-dimensional electron gas (2DEG) layer formed in the compound semiconductor substrate and extending between the source region and the drain region, a gate region formed on the compound semiconductor substrate and positioned between the source region and the drain region, and a plurality of isolated charge control structures disposed between the gate region and the drain region.

In some embodiments, each of the plurality of isolated charge control structures are arranged to selectively reduce a charge density in the 2DEG layer under each of the plurality of isolated charge control structures.

In some embodiments, each of the plurality of isolated charge control structures is disposed on the compound semiconductor substrate.

In some embodiments, each of the plurality of isolated charge control structures includes a GaN layer.

In some embodiments, the GaN layer includes a P-type GaN layer.

In some embodiments, each of the plurality of isolated charge control structures is disposed within the compound semiconductor substrate.

In some embodiments, each of the plurality of isolated charge control structures includes an isolation implanted region.

In some embodiments, each of the plurality of isolated charge control structures includes an isolation implanted region formed through a P-type GaN layer.

In some embodiments, each of the plurality of isolated charge control structures are formed in shape of an island.

In some embodiments, the plurality of isolated charge control structures are disposed proximal to the gate region.

In some embodiments, the plurality of isolated charge control structures are arranged to reduce an electric field proximal to the gate region.

In some embodiments, a pattern density of the plurality of isolated charge control structures is constant in regions proximal to the gate region and regions proximal to the drain region.

In some embodiments, each of the plurality of isolated charge control structures are formed in shape of a trapezoid extending from the gate region towards the drain region.

In some embodiments, each of the plurality of isolated charge control structures are formed in shape of an ellipse extending from the gate region towards the drain region.

In some embodiments, a method of controlling a charge density in a two-dimensional electron gas (2DEG) layer in a gallium nitride (GaN) device is disclosed. The method includes providing a compound semiconductor substrate comprising a first layer and a second layer, and further comprising a 2DEG layer formed between the first layer and the second layer, forming an active region, forming a gate region on the compound semiconductor substrate and across the active region, and forming a plurality of isolated charge control structures on the active region, where each of the plurality of isolated charge control structures are arranged to selectively reduce a charge density in the 2DEG layer under each of the plurality of isolated charge control structures.

In some embodiments, in the disclosed method each of the plurality of isolated charge control structures includes a P-type GaN layer.

In some embodiments, in the disclosed method each of the plurality of isolated charge control structures includes an isolation implanted region.

In some embodiments, gallium nitride (GaN) device is disclosed. The GaN device includes a compound semiconductor substrate, a two-dimensional electron gas (2DEG) layer formed in the compound semiconductor substrate, a resistor formed in the compound semiconductor substrate, the resistor comprising an active region, and a first and second ohmic contacts, and a plurality of isolated charge control structures formed on at least a portion of the active region, where each of the plurality of isolated charge control structures is arranged to reduce a charge density in the 2DEG layer under each of the plurality of isolated charge control structures thereby causing an increase in a resistance of the resistor.

In some embodiments, each of the plurality of isolated charge control structures of the resistor includes a P-type GaN layer.

In some embodiments, a spacing between each adjacent charge control structure of the resistor is lower than a minimum manufacturing width for the active region.

DETAILED DESCRIPTION

Structures and related techniques disclosed herein relate generally to control of two-dimensional electron gas (2DEG) charge density in gallium nitride (GaN) devices. More specifically, devices, structures and related techniques disclosed herein relate to GaN transistors where P-type GaN structures, isolation implant patterning, and isolation implantation through P-type GaN structures can be utilized to control 2DEG charge density. In various embodiments, the 2DEG charge density control can enable modification of the transistor threshold voltage (Vth), and/or lowering of output capacitance of the transistor enabling relatively high operating frequency. In some embodiments, the control of 2DEG charge density can enable a reduction in the size of the GaN transistor. In various embodiments, the control of the 2DEG charge density can enable fabrication of relatively high value 2DEG resistors in same area, thus enabling a reduction in overall die area. Various inventive embodiments are described herein, including methods, processes, systems, devices, and the like.

Several illustrative embodiments will now be described with respect to the accompanying drawings, which form a part hereof. The ensuing description provides embodiment(s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word "example" or "exemplary" is used herein to mean "serving as an example, instance, or illustration." Any embodiment or design described herein as "exemplary" or "example" is not necessarily to be construed as preferred or advantageous over other embodiments or designs.

Figure 1A:
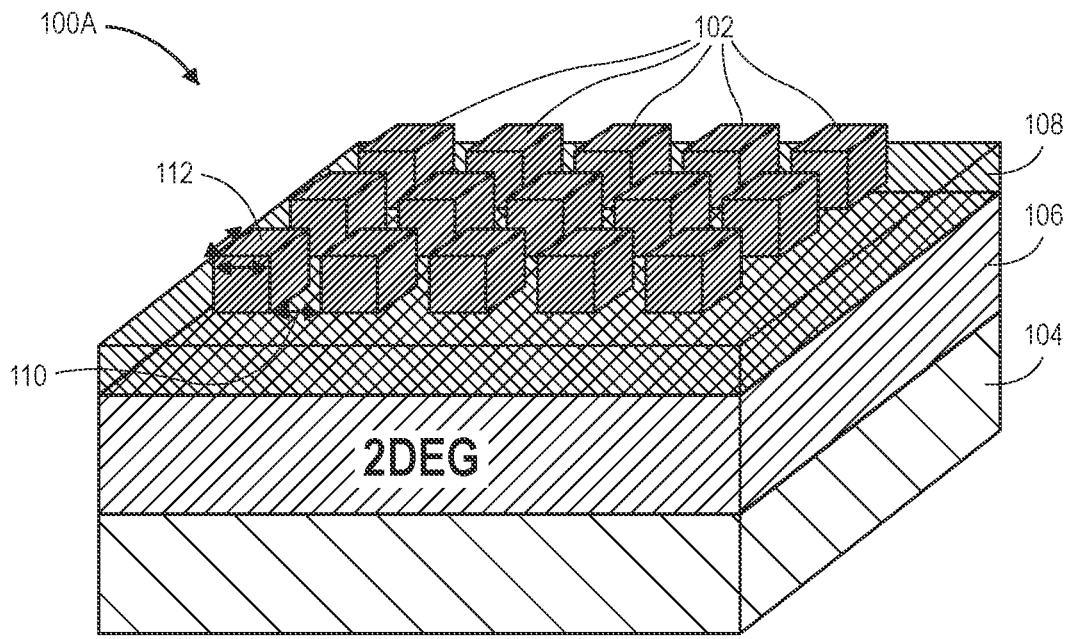
FIG. 1A illustrates a side 3-D view of a GaN device using P-type GaN structures to control 2DEG charge density according to an embodiment of the disclosure.

FIG. 1A illustrates an isometric view of a GaN device 100A using P-type GaN structures to control 2DEG charge density according to an embodiment of the disclosure. As shown in FIG. 1A, the GaN device 100A can include a GaN layer 104, an AlGaN layer 108 and a 2DEG layer 106 formed between the GaN layer and the AlGaN layer. In some embodiments, P-type GaN islands 102 can be added to the device 100A where the P-type GaN islands are disposed on the AlGaN layer 108. The P-type GaN islands 102 can deplete charge carriers and reduce charge density in the 2DEG layer 106. The amount of 2DEG charge density reduction can depend on area 112 and spacing 110 of the P-type GaN islands 102 (discussed in more detail in FIG. 1B). Patterning of P-type GaN islands 102 can provide 2DEG charge density control without a need to change fabrication processes which can entail costly and complex fabrication process changes.

Figure 1B:
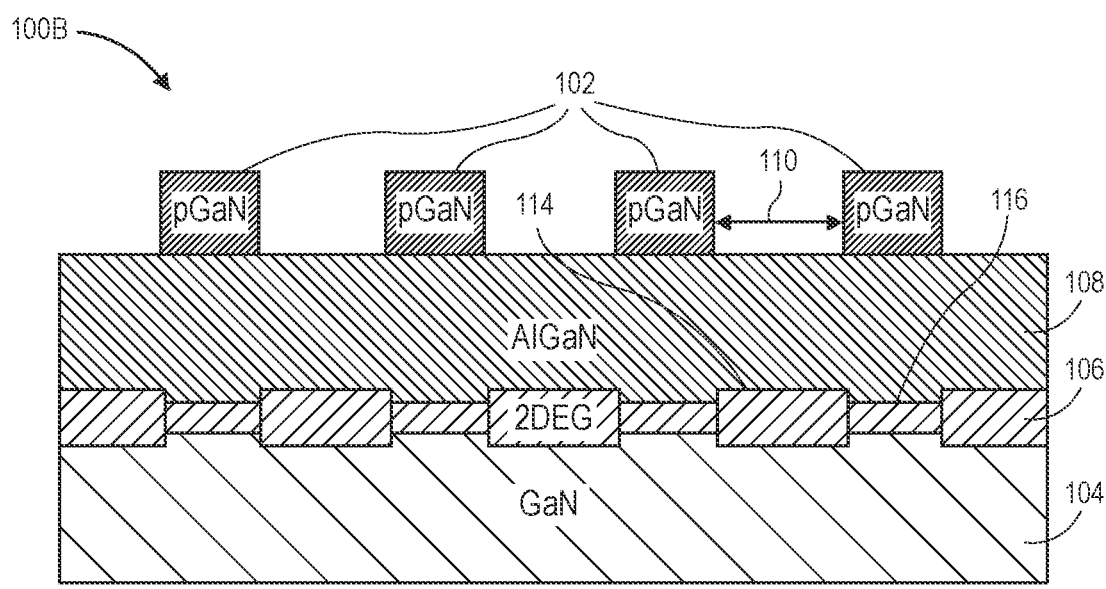
FIG. 1B shows a cross-sectional view of the GaN device of FIG. 1A according to an embodiment of the disclosure.

FIG. 1B illustrates a cross-sectional view 100B of GaN device 100A shown in FIG. 1A. As shown in FIG. 1B, the charge density in 2DEG layer 106 can be reduced under the P-type GaN islands 102 (for example location 116) compared to regions where there are no P-type GaN islands (for example location 114). The amount of 2DEG charge density reduction can depend on area 112 (see FIG. 1A) and spacing 110 of the P-type GaN islands 102. In some embodiments, area 112 of each island 102 can be, for example, 1.0 $um^2$ while spacing 110 between each island can be 1.0 um. In various embodiments, area 112 of islands 102 can be 1.5 $um^2$ with a spacing 110 of 1.5 um, while in other embodiments the area can be between 0.5 and 2.0 $um^2$ with a spacing between 0.5 to 2.0 um, and in yet other embodiments the area can be between 0.2 and 5.0 $um^2$ with a spacing between 0.2 to 5.0 um. As appreciated by one of ordinary skill in the art having the benefit of this disclosure, the area 112 and spacing 110 of the islands 102 can be set to any suitable value. Further, as appreciated by one of ordinary skill in the art, the 2DEG charge density technique described above can employ one or more islands, different sizes and shapes for each island, non-uniform spacing between each island and other characteristics that can be different than those described herein. Moreover, as appreciated by one of ordinary skill in the art, the P-type GaN layer can have varying values of doping densities.

In order to better appreciate the features and aspects of 2DEG charge control structures and techniques for GaN devices according to the present disclosure, further context for the disclosure is provided in the following section by discussing several particular implementations of charge control structures for GaN devices according to embodiments of the present disclosure. These embodiments are for example only and other embodiments can be employed in other compound semiconductor devices such as, but not limited to any high electron mobility transistors (HEMT).

Figure 2A:
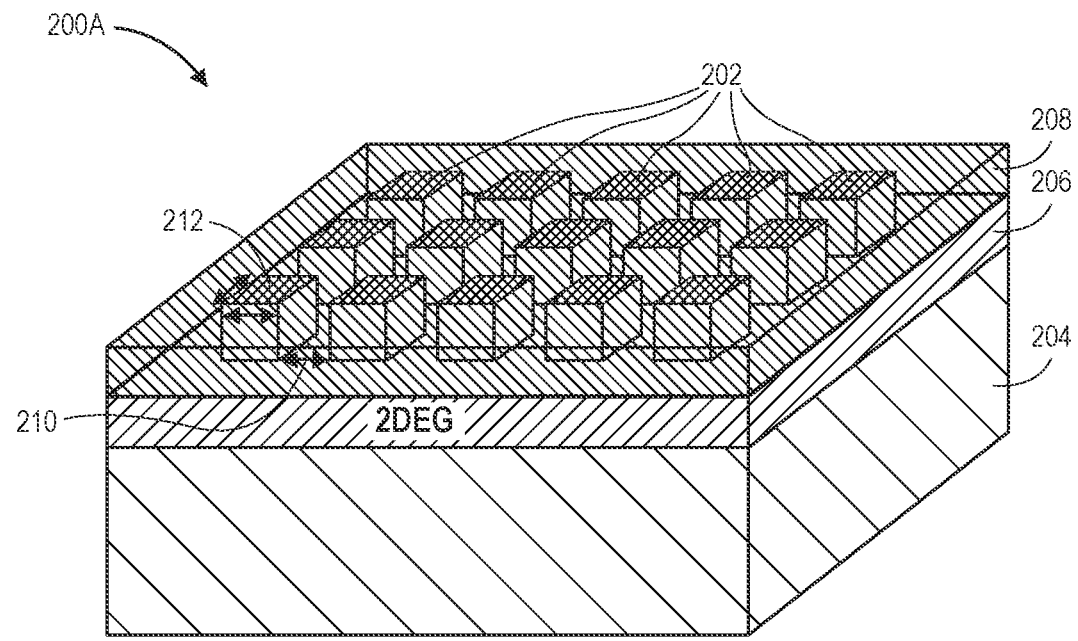
FIG. 2A illustrates a side 3-D view of an embodiment of a GaN device using isolation implant patterning according to an embodiment of the disclosure.

FIG. 2A illustrates an isometric view of an embodiment of GaN device 200A using isolation implant patterning to control 2DEG charge density according to an embodiment of the disclosure. As shown in FIG. 2A, the GaN device 200A can include a GaN layer 204, an AlGaN layer 208 and a 2DEG layer 206 formed between the GaN layer and the AlGaN layer. In some embodiments, isolation implant regions 202 can be utilized in the GaN device 200A where an isolation implant can be placed into the active regions of the GaN device. The isolation implant regions 202 can produce damaged lattice structure in the underlying AlGaN layer 208 and GaN layer 204, eliminating charge carriers in the 2DEG layer 206. Further, the damaged lattice structures can reduce piezoelectric effects beyond the immediate implanted regions and can cause a reduction of charge carriers in the adjacent 2DEG regions (further discussed in FIG. 2B). In some embodiments, the amount of 2DEG charge density reduction can depend on area 212 and spacing 210 of the isolation implant regions 202 (discussed further in FIG. 2B).

Figure 2B:
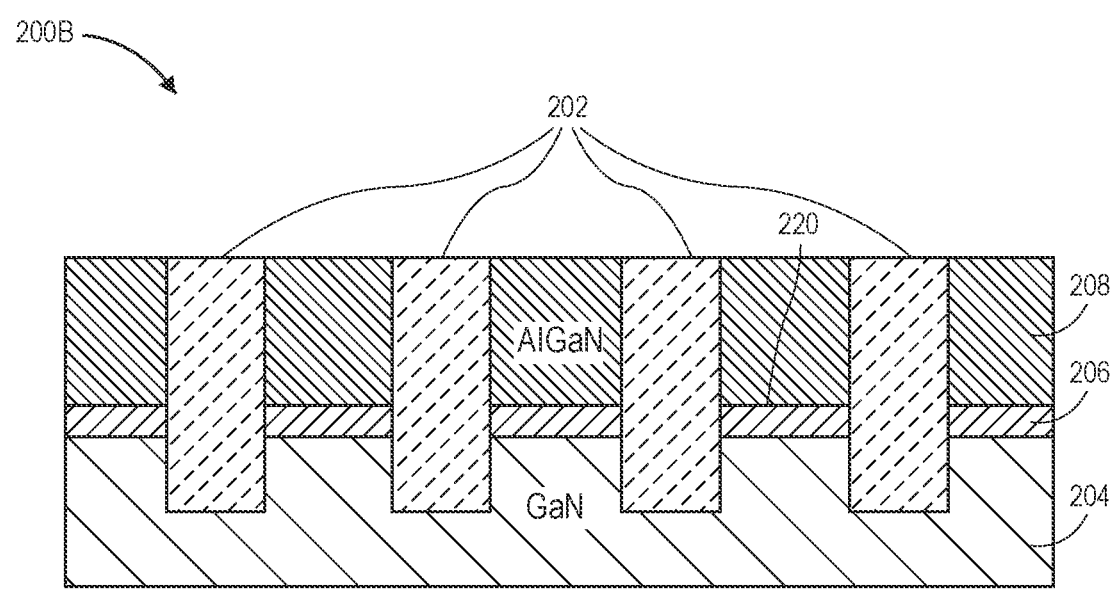
FIG. 2B shows a cross-sectional view of GaN device of FIG. 2A according to an embodiment of the disclosure.

FIG. 2B shows a cross-sectional view 200B of GaN device 200A shown in FIG. 2A. In some embodiments, the 2DEG charge carriers can be eliminated where the isolation implant regions 202 are placed because the isolation implant can penetrate through the AlGaN layer 208 and at least partially through the GaN layer 204 and can damage the lattice structure. Further, damaged lattice structures can cause reduced piezoelectric effects beyond the immediate implanted regions and can cause a reduction of charge carriers in adjacent regions 220. The amount of 2DEG charge density reduction can depend on area 212 and spacing 210 of the implant regions 202. An area 212 of implant region 202 can be, for example, 1.0 $um^2$ while a spacing 210 between implant regions can be 1.0 um. In some embodiments an area 212 of implant regions 202 can be 1.5 $um^2$ with a spacing 210 of 1.5 um, while in other embodiments the area can be between 0.5 and 2.0 $um^2$ with a spacing between 0.5 to 2.0 um, and in various embodiments the area can be between 0.2 and 5.0 $um^2$ with a spacing between 0.2 to 5.0 um. As appreciated by one of ordinary skill in the art having the benefit of this disclosure, the area and spacing of implant regions 202 can be set to any suitable value. Further, as appreciated by one of ordinary skill in the art, the disclosed technique to modify the 2DEG charge density can include one or more implant regions 202, different sizes and shape of implant regions and other characteristics that can be different than those described herein. Moreover, as appreciated by one of ordinary skill in the art, the isolation dose and implant energy can have any suitable values.

Figure 3A:
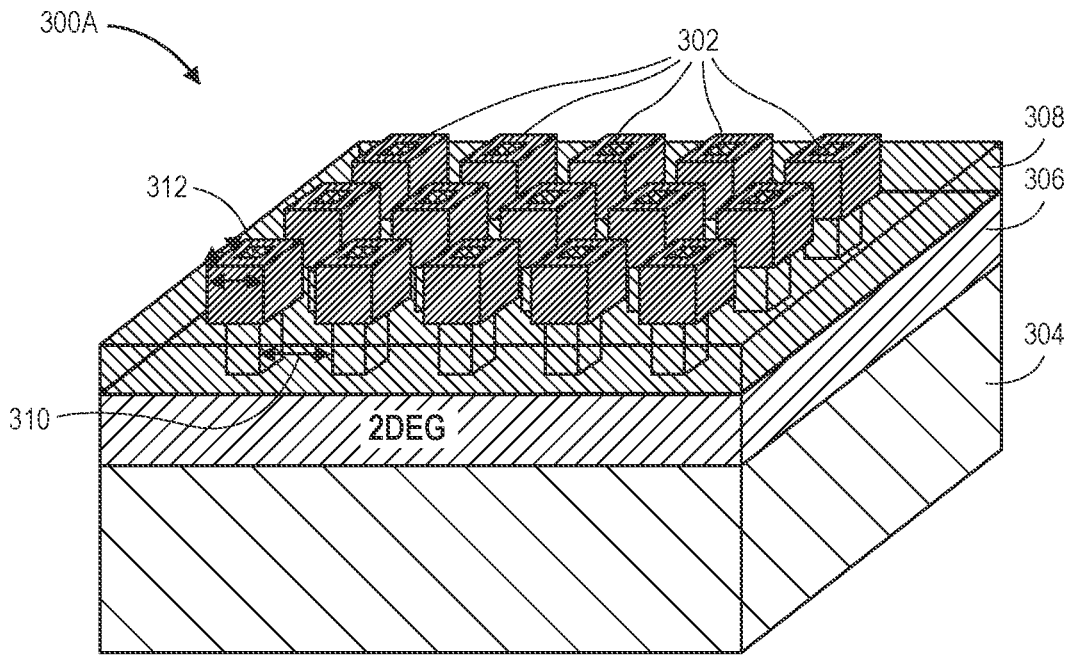
FIG. 3A illustrates a side 3-D view of an embodiment of a GaN device using isolation implant through P-type GaN structures according to an embodiment of the disclosure.

FIG. 3A illustrates an isometric view of an embodiment of GaN device 300A using isolation implanted regions through P-type GaN structures, according to an embodiment of the disclosure. In the illustrated embodiment, isolation implanted regions 302 through P-type GaN structures 320 can be utilized to control charge density in 2DEG layer 306 of the GaN device 300A. As shown in FIG. 3A, the GaN device 300A can include a GaN layer 304, an AlGaN layer 308 and a 2DEG layer 306 formed between the GaN layer and the AlGaN layer. In some embodiments, isolation implanted regions 302 can be formed by implanting though P-type GaN structures 320. The isolation implanted regions 302 can be utilized in active regions of GaN device 300A to reduce the charge density in the 2DEG layer 306. In the illustrated embodiment, due to presence of P-type GaN structures 320, the isolation implanted regions 302 can penetrate less into the substrate, thus the produced lattice structure damage may not completely eliminate the charge carriers in the 2DEG layer 306. The amount of 2DEG charge density reduction can depend on area 312 and spacing 310 of the isolation implanted regions 302 (discussed further in FIG. 2B).

Figure 3B:
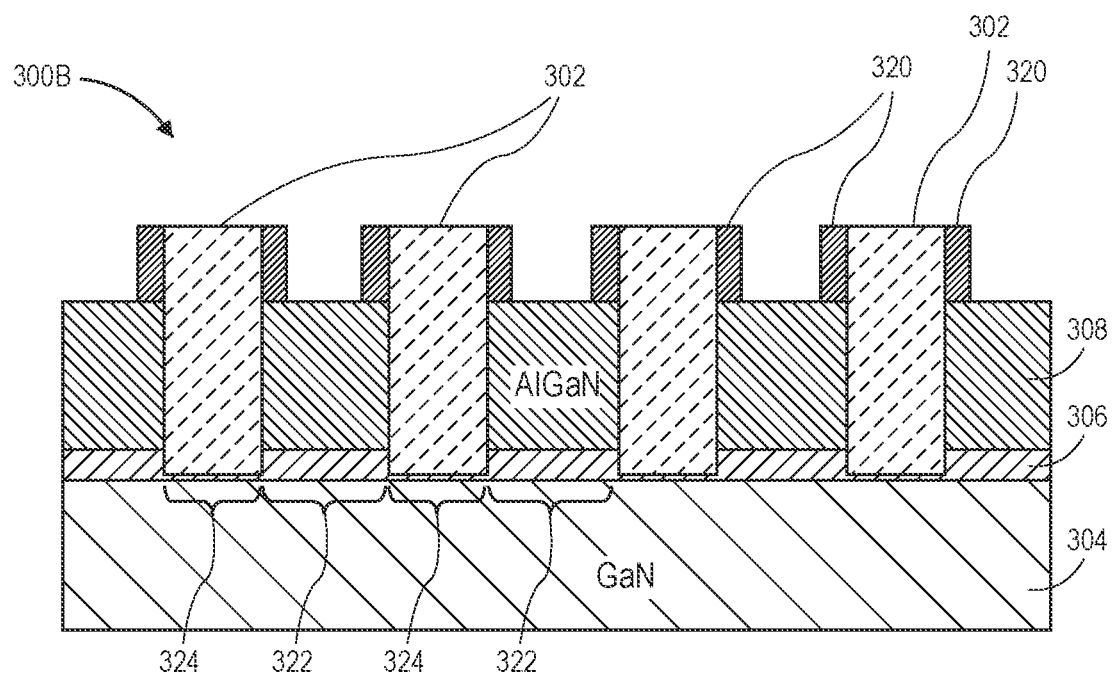
FIG. 3B shows a cross-sectional view of GaN device of FIG. 3A according to an embodiment of the disclosure.

FIG. 3B shows a cross-sectional view 300B of GaN device 300A. In FIG. 3B, GaN layer 304, AlGaN layer 308, and 2DEG layer 306 are shown. Regions of reduced 2DEG charge density 324 in 2DEG layer 306 are aligned with isolation implanted regions 302 and regions of increased charge density 322 in 2DEG layer are positioned in between isolation implanted regions. The charge carriers in 2DEG layer 306 can be reduced where the isolation implanted regions 302 are placed because the isolation implant through P-type GaN structure 320 can penetrate through the AlGaN layer 308 and damage the lattice structure, however in this embodiment isolation implantation may penetrate into the GaN layer but not as deep as direct implantation on AlGaN surface. Less penetration can lower the implantation-based strain reduction compared to the direct implantation on AlGaN surface. In this way, the isolation implanted regions 302 can cause a reduction of carrier charges in the 2DEG layer 306 proximate the isolation implanted regions 302, but do not cause a complete elimination of the carriers.

The amount of 2DEG charge density reduction can depend on area 312 (see FIG. 3A) and spacing 310 of the isolation implanted regions 302. An area 312 of isolation implanted regions 302 can be, for example, 1.0 $um^2$ while a spacing 310 between isolation implanted regions can be 1.0 um. In some embodiments an area 312 of isolation implanted regions 302 can be 1.5 um² with a spacing 310 of 1.5 um, while in other embodiments the area can be between 0.5 and 2.0 um² with a spacing between 0.5 to 2.0 um, and in various embodiments the area can be between 0.2 and 5.0 um² with a spacing between 0.2 to 5.0 um. As appreciated by one of ordinary skill in the art having the benefit of this disclosure, the area 312 and spacing 310 of isolation implanted regions 302 can be set to any suitable values. Further, as appreciated by one of ordinary skill in the art, disclosed 2DEG charge density modification technique disclosed above can include one or more isolation implanted regions, different sizes and shapes for isolation implanted regions and other characteristics that can be different than those described herein. Moreover, as appreciated by one of ordinary skill in the art, the isolation dose and implant energy can have any suitable values.

Figure 4A:
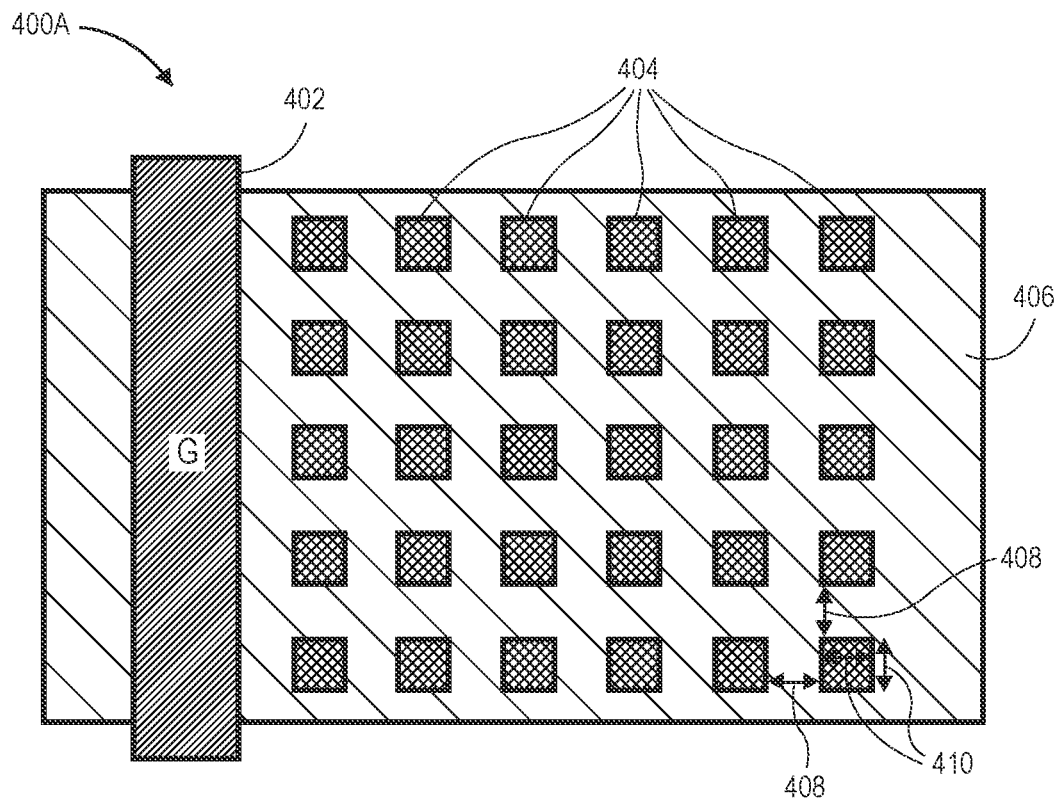
FIG. 4A illustrates a plan view of a GaN device according to an embodiment of the disclosure.

FIG. 4A illustrates a plan view of GaN device 400A according to an embodiment of the disclosure. GaN device 400A can include a gate 402 and an active region 406, where 2DEG charge control structures 404 have been added to the active region. Charge control structures 404 can have areas 408 and spacings 410. Charge control structures may be formed in shape of islands. Value of the areas 408 and spacings 410 may vary. In some embodiments structures 404 can be P-type GaN structures similar to device 100A, while in other embodiments they can be isolation implant regions similar to device 200A and in various embodiments they can be isolation implanted regions through P-type GaN structures similar to device 300A. The area 408, spacing 410 and the number of structures 404 can be used to control 2DEG charge density as shown in FIG. 400B. In the illustrated embodiment, a density of the islands can be constant in regions proximal and distal to the gate 402.

Figure 4B:
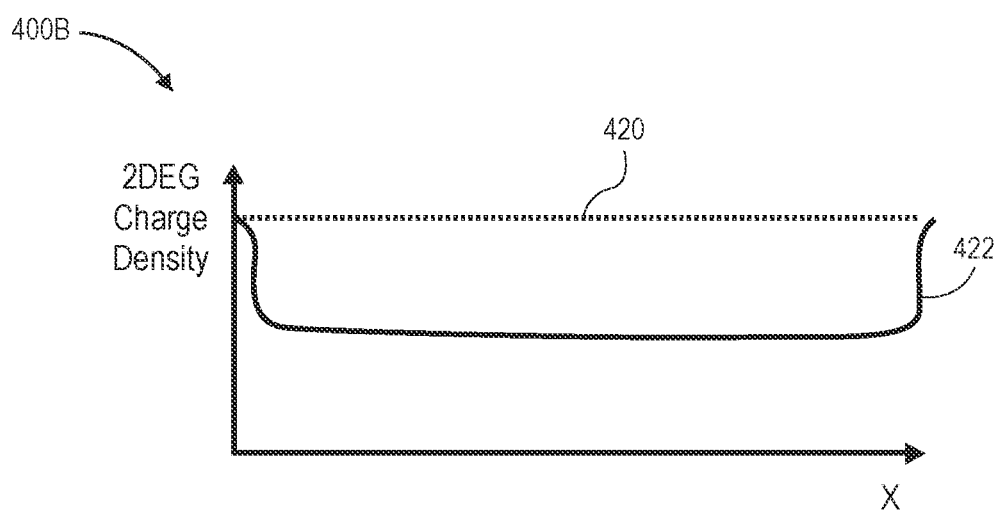
FIG. 4B shows 2DEG charge density as a function of location in the GaN device of FIG. 4A.

As illustrated in FIG. 4B, graph 400B shows a first plot 422 of 2DEG charge density as a function of location in the active region 406 with charge control structures 404, while second plot 420 shows the charge density without charge control structures 404 (for reference). As can be seen in plot 422, the charge density is reduced where structures 404 are present, and is increased in regions without structures 404. Area 408 of structures 404 can be, for example, 1.0 um² while a spacing 410 between structures 404 can be 1.0 um. In some embodiments the area 408 can be 1.5 um² with a spacing 410 of 1.5 um, while in other embodiments the area can be between 0.5 and 2.0 um² with a spacing between 0.5 to 2.0 um, and in various embodiments the area can be between 0.2 and 5.0 um² with a spacing between 0.2 to 5.0 um. As appreciated by one of ordinary skill in the art having the benefit of this disclosure, the area 408 and spacing 410 of the structures 404 can be set to any suitable value. Further, as appreciated by one of ordinary skill in the art, structures 404 can have different sizes and shapes, for example, but not limited to, square, rectangular, circular, triangular, or trapezoid and can have other characteristics that can be different than those described here.

Figure 5A:
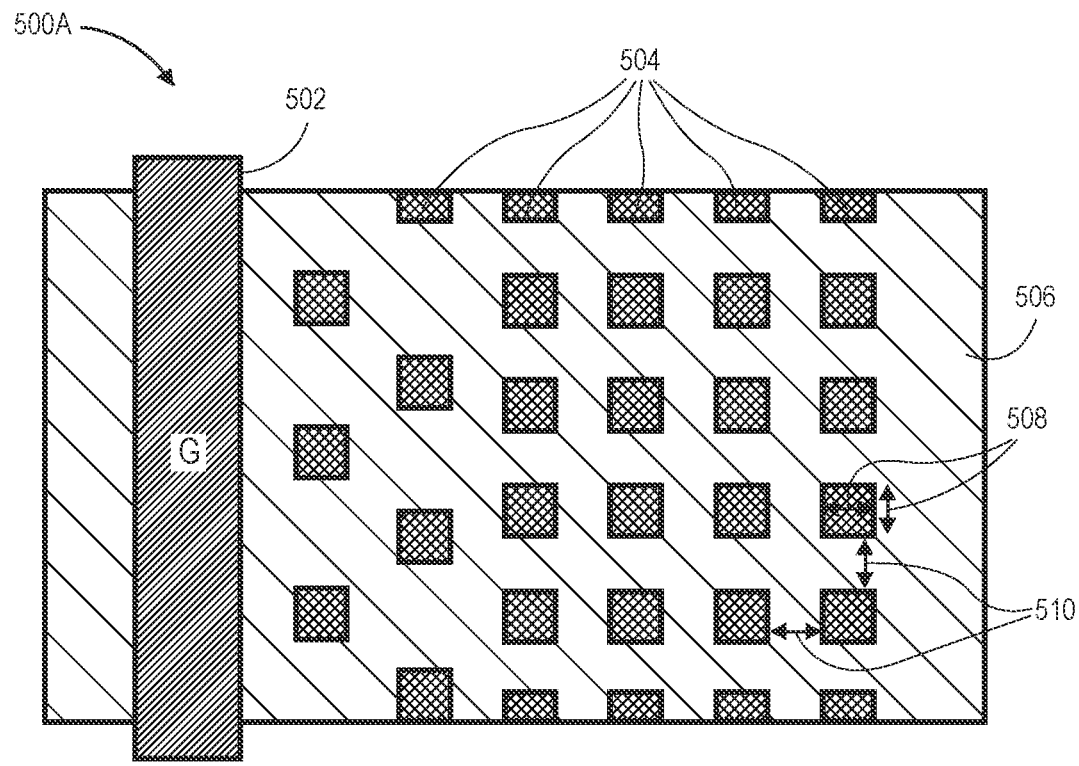
FIG. 5A illustrates a plan view of a GaN device according to an embodiment of the disclosure.
Figure 5B:
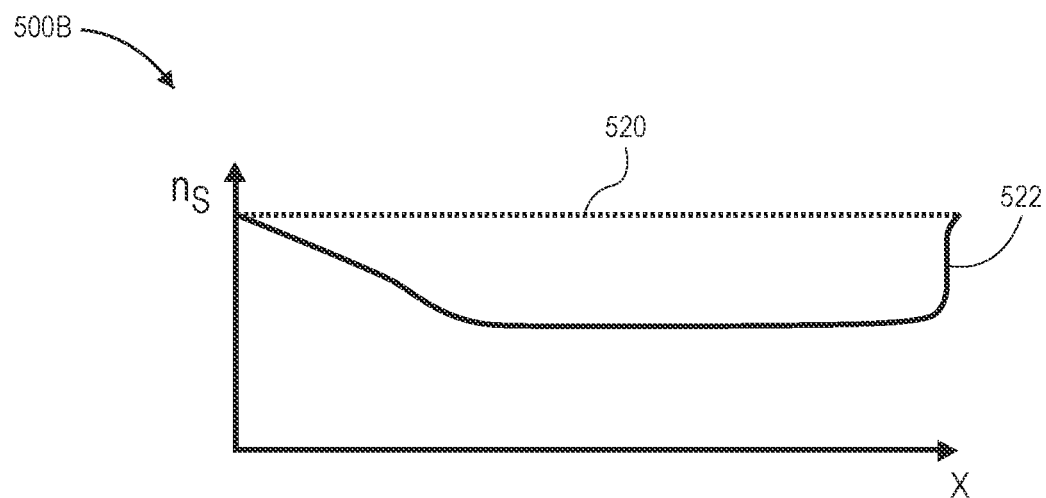
FIG. 5B shows 2DEG charge density as a function of location in the GaN device of FIG. 5A.

FIG. 5A illustrates a plan view of GaN device 500A according to an embodiment of the disclosure. GaN device 500A can include a gate 502 and an active region 506, where 2DEG charge control structures 504 have been added to the active region. Structures 504 can have areas 508 and spacings 510 that can vary. Structures 504 can be P-type GaN structures similar to device 100A, isolation implant regions similar to device 200A or isolation implant regions through P-type GaN structures similar to device 300A. The area 508, spacing 510 and the number of structures 504 can be used to control 2DEG charge density as shown in FIG. 5B. As illustrated in FIG. 5B, graph 500B shows 2DEG charge density as a function of location in the active region. First plot 522 shows 2DEG charge density with structures 504, while plot 520 shows 2DEG charge density without structures 504. In the illustrated embodiment, a density of charge control structures (islands) may decrease in regions proximal the gate 502 and increase in regions distal to the gate 502.

As can be seen in graph 500B, the charge density is reduced where structures 504 are present, and is increased in regions without structures 504. In regions proximal to the gate 502, there is a lower density of structures 504, which can result a higher charge density in those regions. Area 508 of structures 504 can be, for example, 1.0 um² while a spacing 510 between structures 504 can be 1.0 um. In some embodiments, area 508 can be 1.5 um² with a spacing 510 of 1.5 um, while in other embodiments the area can be between 0.5 and 2.0 um² with a spacing between 0.5 to 2.0 um, and in various embodiments the area can be between 0.2 and 5.0 um² with a spacing between 0.2 to 5.0 um. As appreciated by one of ordinary skill in the art having the benefit of this disclosure, the area 508 and spacing 510 of the structures 504 can be set to any suitable value. Further, as appreciated by one of ordinary skill in the art, structures 504 can have different sizes and shapes, for example, but not limited to, square, rectangular, circular, triangular, or trapezoid and can have other characteristics that can be different than those described here.

Figure 6A:
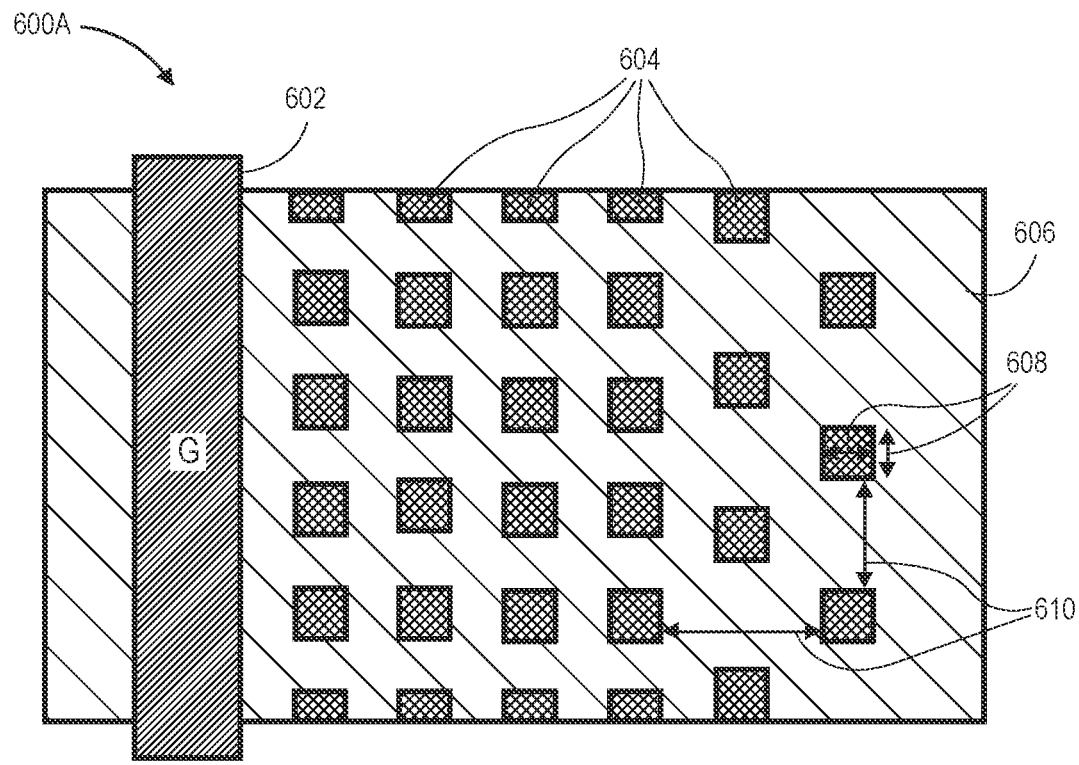
FIG. 6A illustrates a plan view of a GaN device according to an embodiment of the disclosure.
Figure 6B:
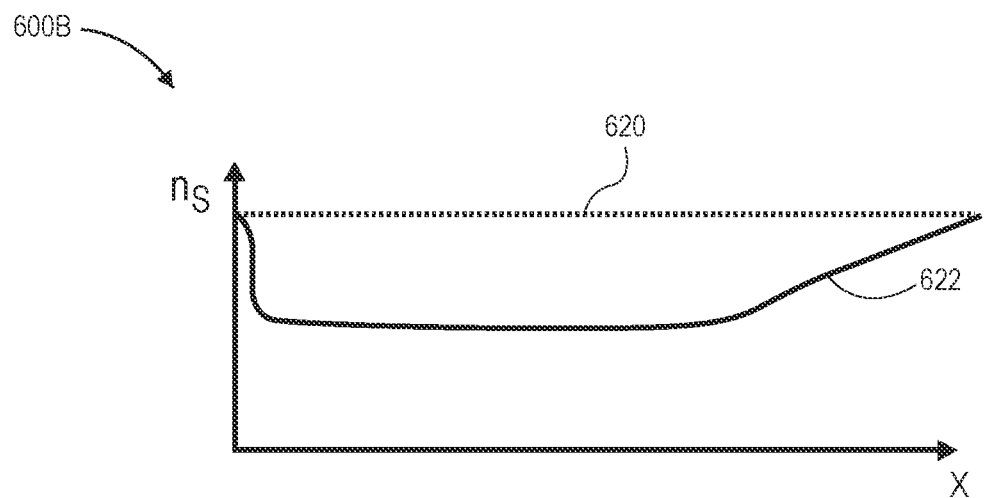
FIG. 6B shows 2DEG charge density as a function of location in the GaN device of FIG. 6A.

FIG. 6A illustrates a plan view of GaN device 600A according to an embodiment of the disclosure. GaN device 600A can include a gate 602 and an active region 606, where 2DEG charge control structures 604 have been added to the active region. Structures 604 can have areas 608 and spacings 610 that can vary. Structures 604 can be P-type GaN structures similar to device 100A, isolation implant regions similar to device 200A or isolation implant regions through P-type GaN structures similar to device 300A. The area 608, spacing 610 and the number of structures 604 can be used to control 2DEG charge density as shown in FIG. 6B. As illustrated in FIG. 6B, graph 600B shows 2DEG charge density as a function of location in the active region. First plot 622 shows 2DEG charge density with structures 604, while second plot 620 shows 2DEG charge density without structures 604. In the illustrated embodiment, a density of the charge control structures (islands) may be constant in regions proximal the gate 602 and decrease in regions distal to the gate 602.

As can be seen in first plot 622, the 2DEG charge density is reduced where structures 604 are present, and is increased in regions without structures 604. In regions of active region 606 that are away from the gate 602, there is a lower density of structures 604, which can result in a higher charge density in those regions. Area 608 of structures 604 can be, for example, 1.0 um² while a spacing 610 between structures 604 can be 1.0 um. In some embodiments the area 608 can be 1.5 um² with a spacing 610 of 1.5 um, while in other embodiments the area can be between 0.5 and 2.0 um² with a spacing between 0.5 to 2.0 um, and in various embodiments the area can be between 0.2 and 5.0 um² with a spacing between 0.2 to 5.0 um. As appreciated by one of ordinary skill in the art having the benefit of this disclosure, the area 608 and spacing 610 of the structures 604 can be set to any suitable value. Further, as appreciated by one of ordinary skill in the art, structures 604 can have different sizes and shapes, for example, but not limited to, square, rectangular, circular, triangular, or trapezoid and can have other characteristics that can be different than those described here.

Figure 7A:
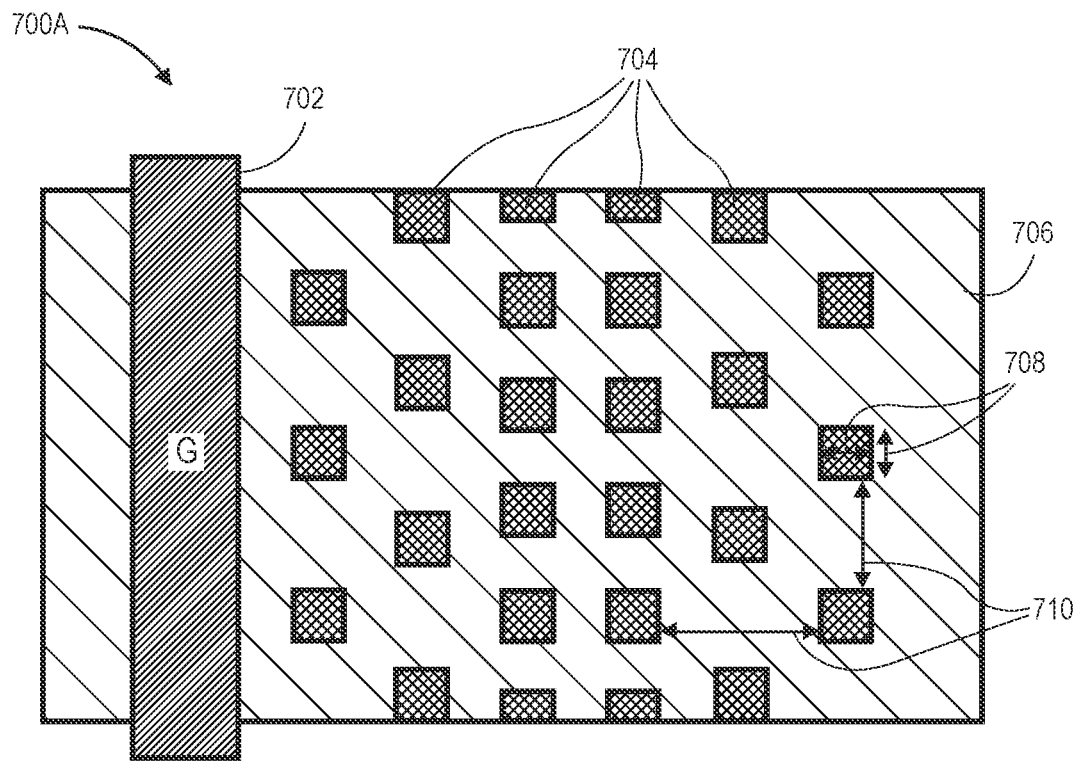
FIG. 7A illustrates a plan view of a GaN device according to an embodiment of the disclosure.
Figure 7B:
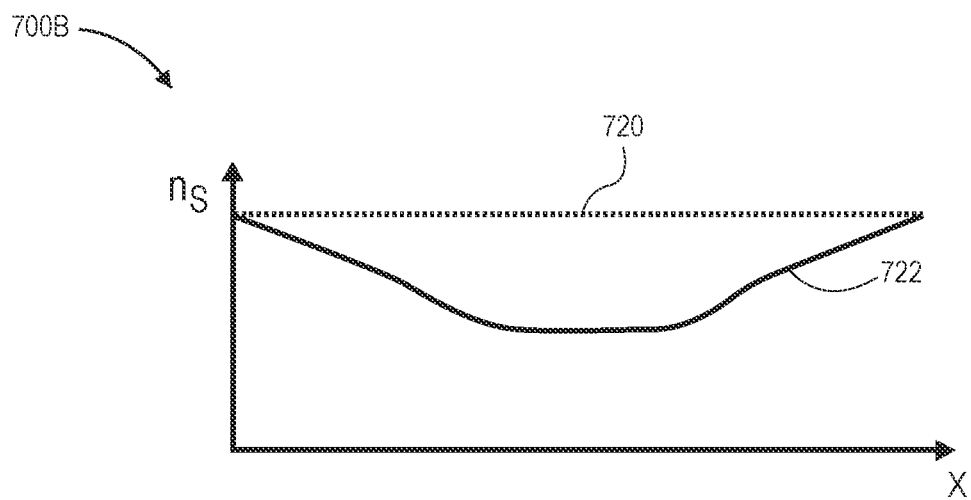
FIG. 7B shows 2DEG charge density as a function of location in the GaN device of FIG. 7A.

FIG. 7A illustrates a plan view of GaN device 700A according to an embodiment of the disclosure. GaN device 700A can include a gate 702 and an active region 706, where 2DEG charge control structures 704 have been added to the active region. Structures 704 can have areas 708 and spacings 710 that can vary. Structures 704 can be P-type GaN structures similar to device 100A, isolation implant regions similar to device 200A or isolation implant regions through P-type GaN structures similar to device 300A. The area 708, spacing 710 and the number of structures 704 can be used to control 2DEG charge density as shown in FIG. 700B. As illustrated in FIG. 7B, graph 700B shows 2DEG charge density as a function of location in the active region 706. First plot 722 shows the 2DEG charge density with structures 704, while second plot 720 shows the 2DEG charge density without structures 704. In the illustrated embodiment, a density of the charge control structures (islands) may decrease in regions proximal the gate 702, increase and decrease in regions distal to the gate 702.

As can be seen in graph 700B, the charge density is reduced where structures 704 are present, and is increased in regions without structures 704. In regions proximate and away from the gate 702, there is a lower density of 704, which can result in a higher charge density in those regions. Area 708 of structures 704 can be, for example, 1.0 um$^2$ while a spacing 710 between structures 704 can be 1.0 um. In some embodiments the area 708 can be 1.5 um$^2$ with a spacing 710 of 1.5 um, while in other embodiments the area can be between 0.5 and 2.0 um$^2$ with a spacing between 0.5 to 2.0 um, and in various embodiments the area can be between 0.2 and 5.0 um$^2$ with a spacing between 0.2 to 5.0 um. As appreciated by one of ordinary skill in the art having the benefit of this disclosure, the area 708 and spacing 710 of the structures 704 can be set to any suitable value. Further, as appreciated by one of ordinary skill in the art, structures 704 can have different sizes and shapes, for example, but not limited to, square, rectangular, circular, triangular, or trapezoid and can have other characteristics that can be different than those described here.

Figure 8A:
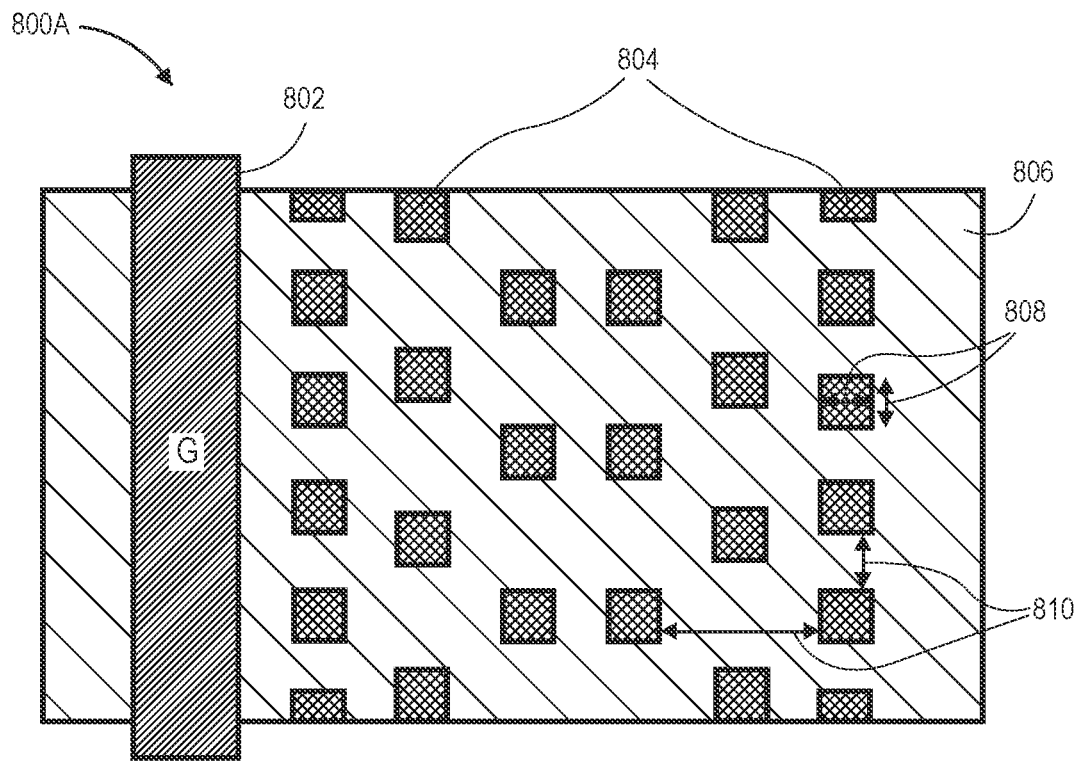
FIG. 8A illustrates a plan view of a GaN device according to an embodiment of the disclosure.
Figure 8B:
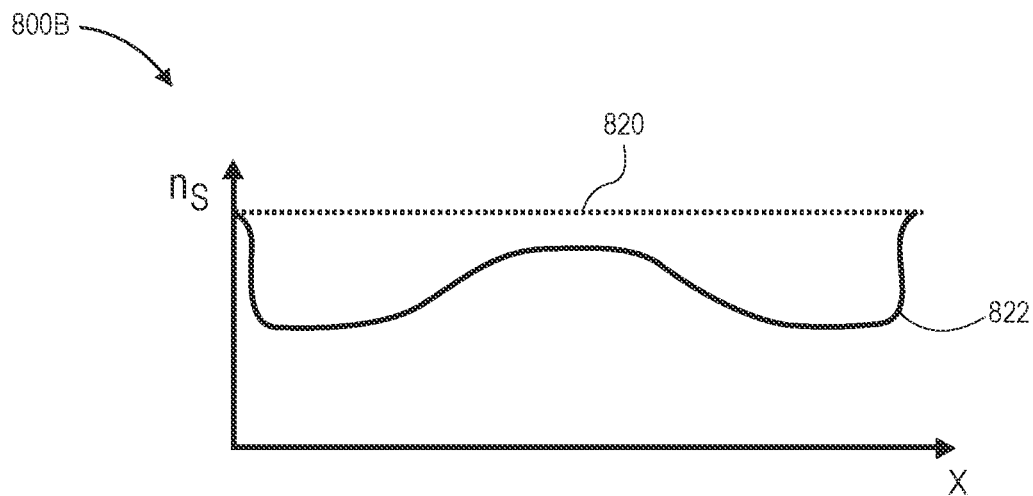
FIG. 8B shows 2DEG charge density as a function of location in the GaN device of FIG. 8A.

FIG. 8A illustrates a plan view of GaN device 800A according to an embodiment of the disclosure. GaN device 800A can include a gate 802 and an active region 806, where 2DEG charge control structures 804 have been added to the active region. Structures 804 can have areas 808 and spacings 810 that can vary. Structures 804 can be P-type GaN structures similar to device 100A, isolation implant regions similar to device 200A or isolation implant regions through P-type GaN structures similar to device 300A. The area 808, spacing 810 and the number of structures 804 can be used to control 2DEG charge density as shown in FIG. 8B. As illustrated in FIG. 8B, graph 800B shows 2DEG charge density as a function of location in the active region 806. First plot 822 shows charge density in the 2DEG region with structures 804, while second plot 820 shows charge density without structures 804. In the illustrated embodiment, a density of the charge control structures (islands) may be constant in regions proximal the gate 802, decrease and increase in regions distal to the gate 802.

As can be seen in first plot 822, the charge density is reduced where structures 804 are present, and is increased in regions without structures 804. In regions where there is a lower density of structures 804 the charge density can be higher than regions that have a higher density of structures 804. Area 808 of structures 804 can be, for example, 1.0 um$^2$ while a spacing 810 between structures 804 can be 1.0 um. In some embodiments the area 808 can be 1.5 um$^2$ with a spacing 810 of 1.5 um, while in other embodiments the area can be between 0.5 and 2.0 um$^2$ with a spacing between 0.5 to 2.0 um, and in various embodiments the area can be between 0.2 and 5.0 um$^2$ with a spacing between 0.2 to 5.0 um. As appreciated by one of ordinary skill in the art having the benefit of this disclosure, the area and spacing of the structures can be set to any suitable value. Further, as appreciated by one of ordinary skill in the art, structures 804 can have different sizes and shapes, for example, but not limited to, square, rectangular, circular, triangular, or trapezoid and can have other characteristics that can be different than those described here.

Figure 9A:
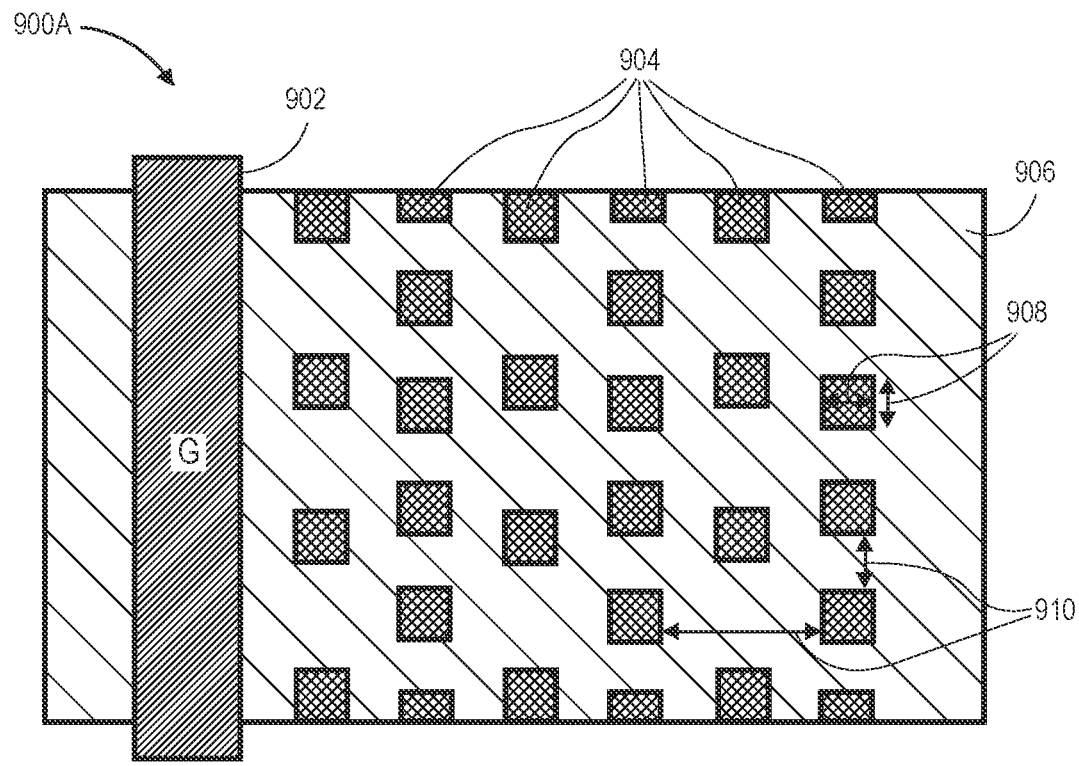
FIG. 9A illustrates a plan view of a GaN device according to an embodiment of the disclosure.
Figure 9B:
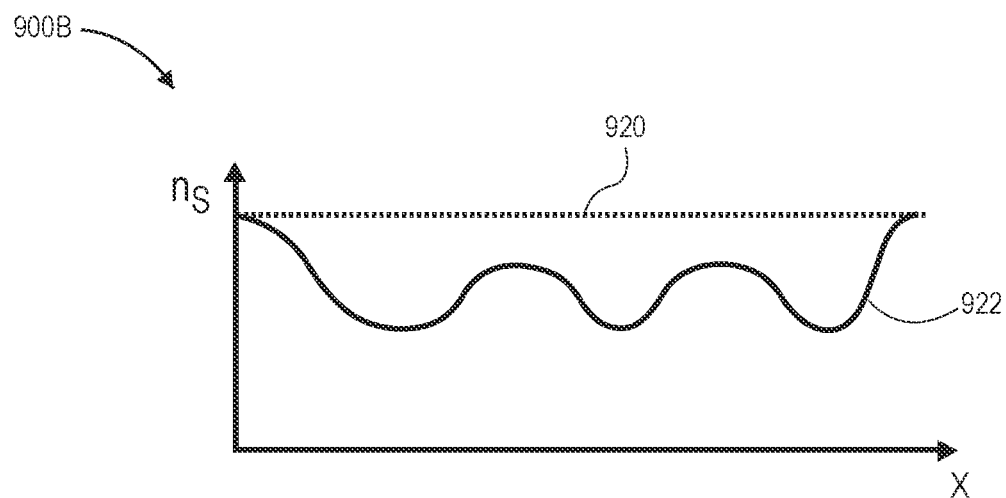
FIG. 9B shows 2DEG charge density as a function of location in the GaN device of FIG. 9A.

FIG. 9A illustrates a plan view of GaN device 900A according to an embodiment of the disclosure. GaN device 900A can include a gate 902 and an active region 906, where 2DEG charge control structures 904 have been added to the active region. Structures 904 can have areas 908 and spacings 910 that can vary. Structures 904 can be P-type GaN structures similar to device 100A, isolation implant regions similar to device 200A or isolation implant regions through P-type GaN structures similar to device 300A. The area 908, spacing 910 and the number of structures 904 can be used to control 2DEG charge density as shown in FIG. 900B. As illustrated in FIG. 9B, graph 900B shows 2DEG charge density as a function of location in the active region 906. First plot 922 shows charge density in the 2DEG layer with structures 904, while second plot 920 shows charge density without structures 904.

As can be seen in FIGS. 9A and 9B, the charge density is reduced where structures 904 are present, and is increased in regions without structures 904. In regions where there is a lower density of structures 904 the charge density can be higher while in regions having a higher density of structures the charge density can be relatively lower. Area 908 of structures 904 can be, for example, 1.0 um$^2$ while a spacing 910 between structures 904 can be 1.0 um. In some embodiments the area 908 can be 1.5 um$^2$ with a spacing 910 of 1.5 um, while in other embodiments the area can be between 0.5 and 2.0 um$^2$ with a spacing between 0.5 to 2.0 um, and in various embodiments the area can be between 0.2 and 5.0 um$^2$ with a spacing between 0.2 to 5.0 um. As appreciated by one of ordinary skill in the art having the benefit of this disclosure, the area 908 and spacing 910 of the structures 904 can be set to any suitable value. Further, as appreciated by one of ordinary skill in the art, structures 904 can have different sizes and shapes, for example, but not limited to, square, rectangular, circular, triangular, or trapezoid and can have other characteristics that can be different than those described here.

Figure 10A:
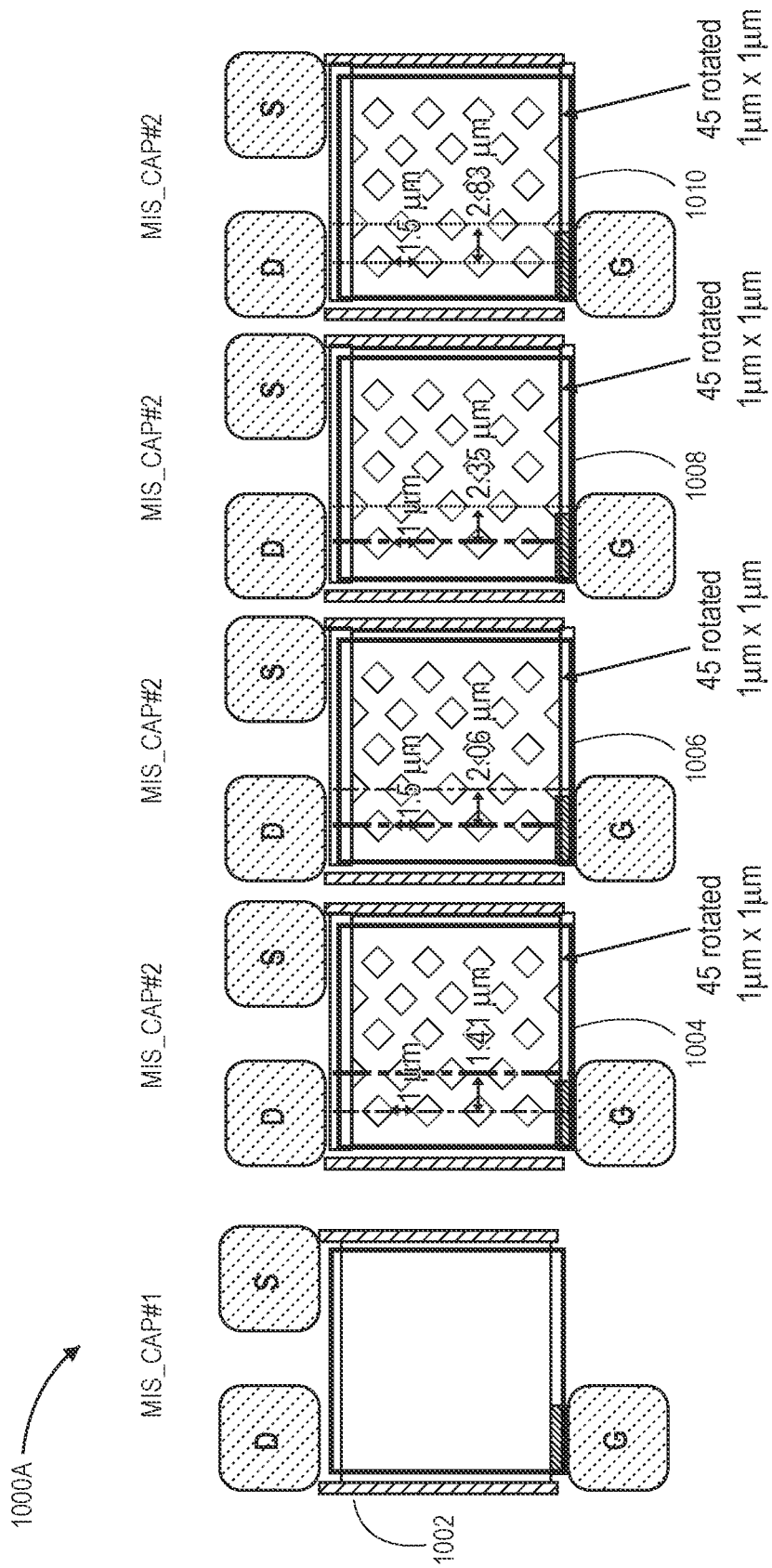
FIG. 10A illustrates various experimental test structures utilizing a charge control structure similar to FIG. 5A.
Figure 10B:
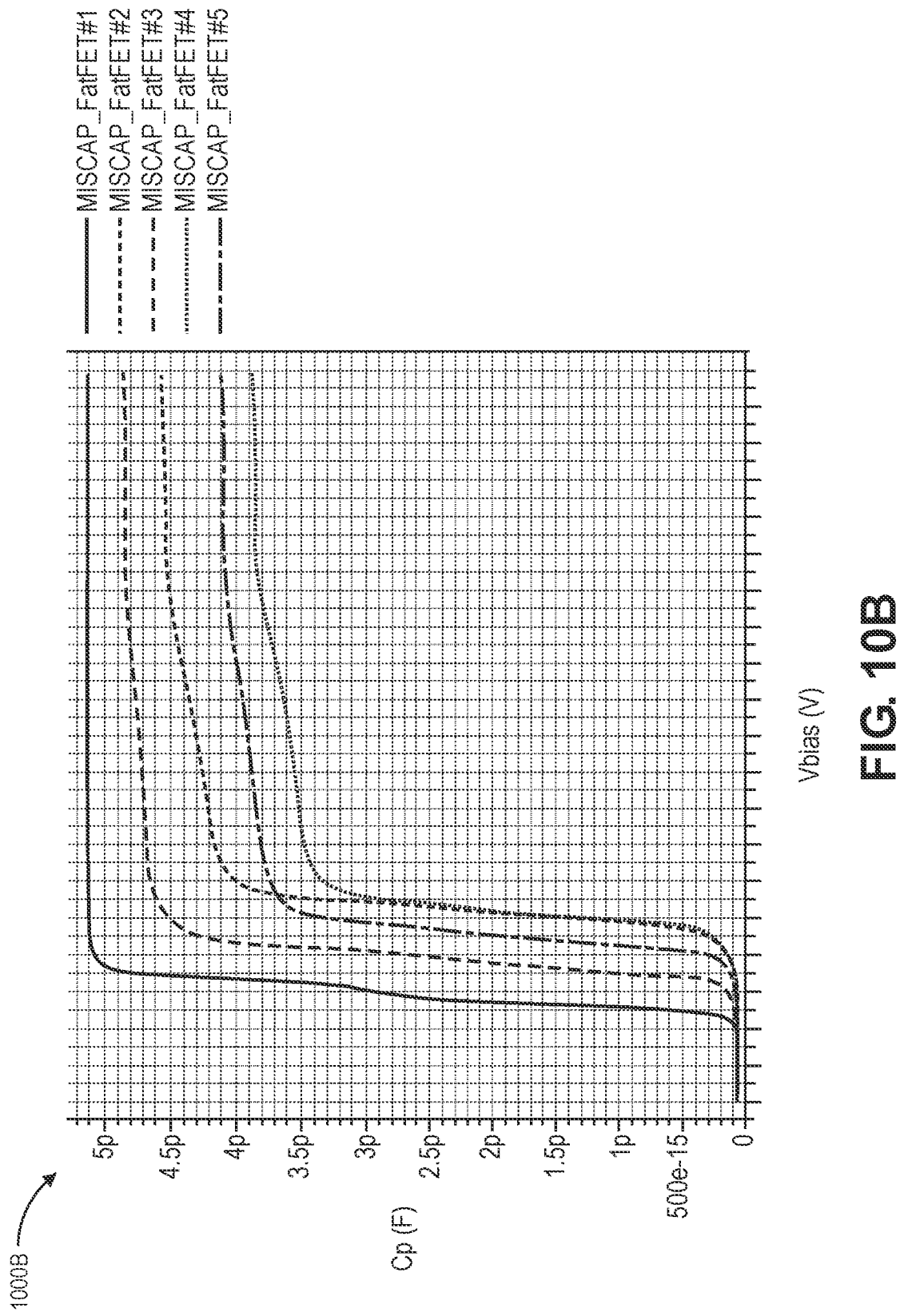
FIG. 10B shows C-V test results for the test structures of FIG. 10A.

FIG. 10A illustrates a series of charge density modification coupons 1000A utilizing 2DEG charge control structures similar to the charge control structures of FIG. 5A. Coupon 1002 is a reference transistor while coupons 1004, 1006, 1008 and 1010 are transistors with varying sizes and spacings for the charge control structures in their active region. FIG. 10B shows C-V test results 1000B for the coupons of FIG. 10A. In FIG. 10B, capacitance as a function of gate to source voltage (Vgs) is plotted for each of the coupons in FIG. 10A. As can be seen in the C-V plots of FIG. 10B, the arrangement of the charge control structures can be used to control charge density in the coupons because the threshold voltage shifts for each of the coupons 1004 to 1010 compared to the threshold voltage of coupon 1002. Further, as size of the charge control structures increases, charge density is reduced. Similarly, as spacing between the charge control structures is reduced the charge density is reduced as well. This reduction in charge density can reduce output capacitance of the transistor and can enable increased switching frequency of the transistor.

Figure 11B:
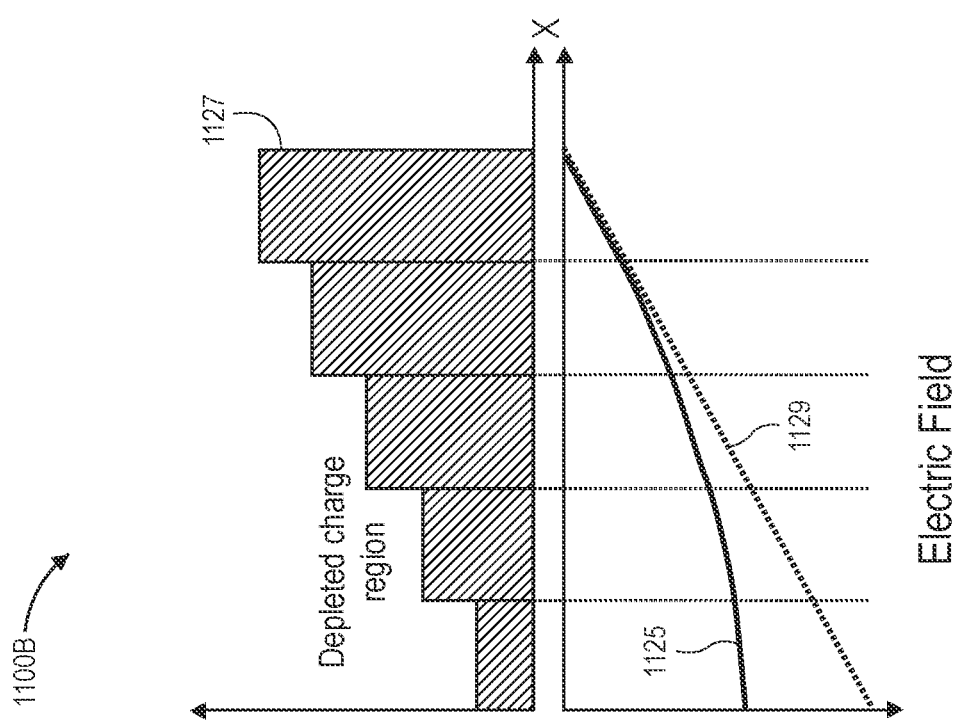
FIG. 11B shows 2DEG charge density and electric field as a function of location along the active region for the GaN transistor of FIG. 11A.
Figure 11A:
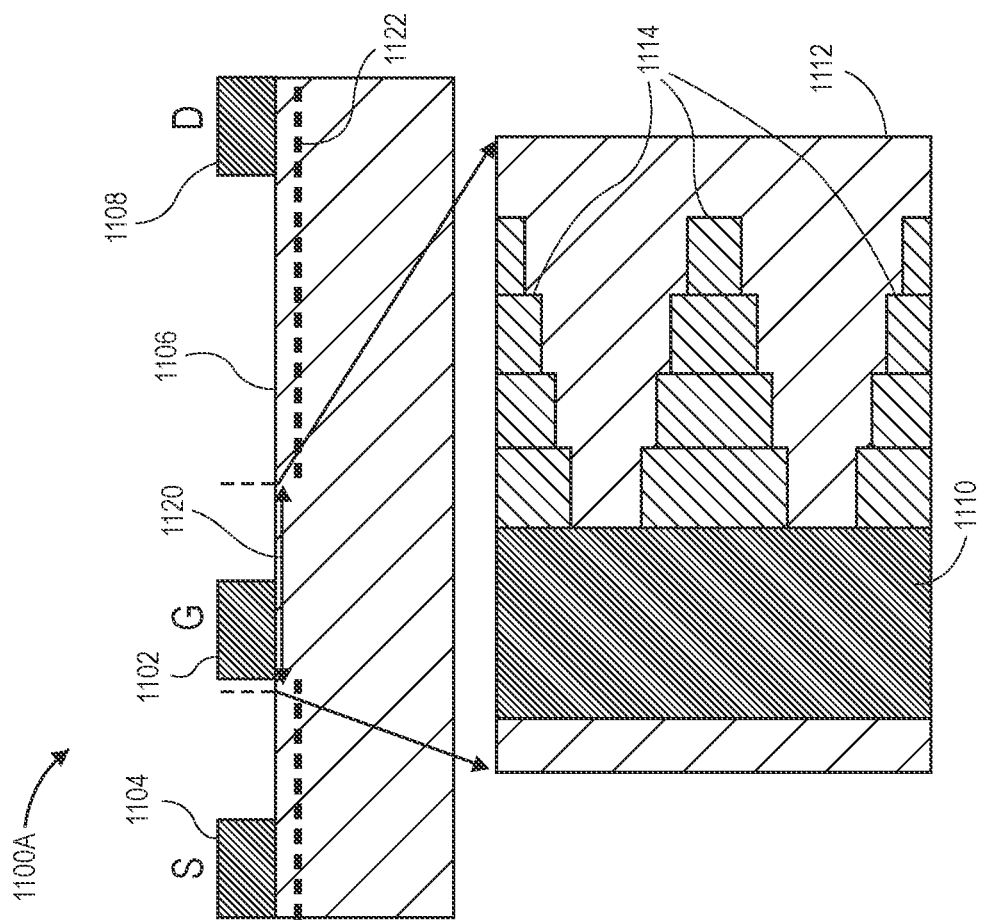
FIG. 11A shows a cross-sectional view and a plan view of a GaN transistor according to an embodiment of the disclosure.

FIG. 11A shows a cross-sectional view and a plan view of a GaN transistor 1100A according to an embodiment of the disclosure. In FIG. 11A, a cross-sectional view of GaN transistor with a source region 1104, gate region 1102, drift region 1106, drain region 1108 and a 2DEG layer 1122 is shown. A plan view of a zoomed-in section 1120 is also shown, where gate 1110, active region 1112 and charge controlled regions 1114 are shown. The charge control regions have a staircase trapezoidal shape. The charge controlled regions 1114 can be P-type GaN, isolation implant regions and/or a combination of the P-type GaN and isolation implant structures. FIG. 11B shows 2DEG charge density and electric field as a function of location along the active region for the GaN transistor 1100A. As shown in FIG. 11B, 2DEG charge density 1127 is reduced proximate to the gate region 1102 due to the presence of the charge controlled regions 1114. As a result of reduced charge density, electric field 1125 is reduced in the region proximate the gate region 1102 compared to the electric field for a case without charge control structures (1129). In various embodiments, reduction of 2DEG charge density proximal to the gate of the transistor can enable reduction in gate length, and can enable a reduction in die area. As appreciated by one of ordinary skill in the art having the benefit of this disclosure, charge control structures can be continuous structure and/or can be in shape of islands. Further, as appreciated by one of ordinary skill in the art, charge control structures can have varying sizes and spacings.

Figure 12B:
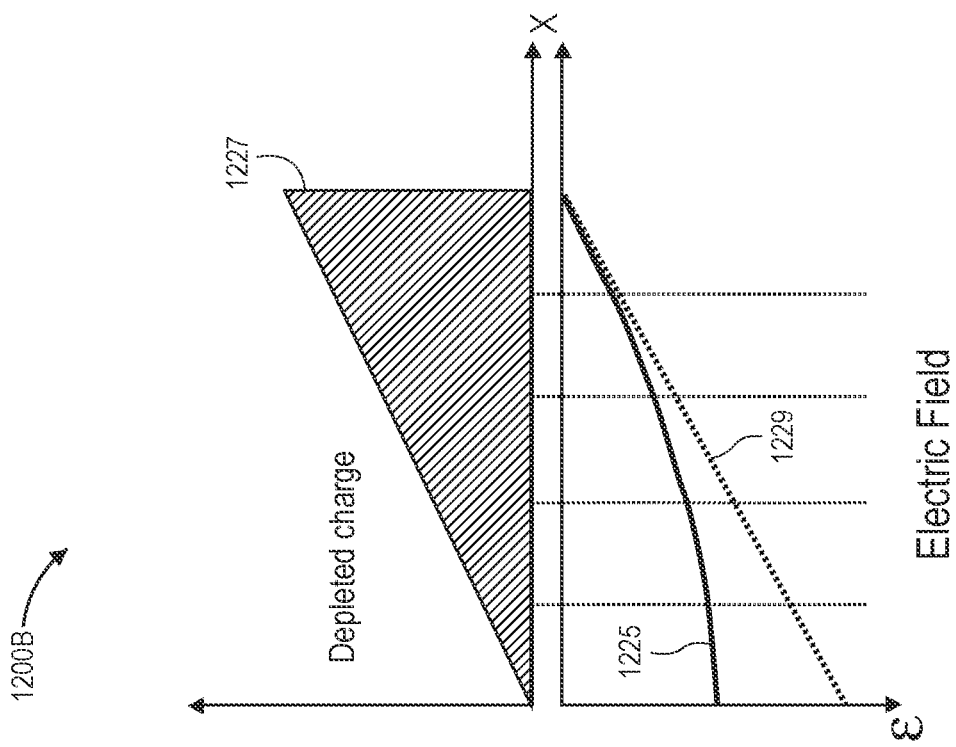
FIG. 12B shows 2DEG charge density and electric field as a function of location along the active region for the GaN transistor of FIG. 12A.
Figure 12A:
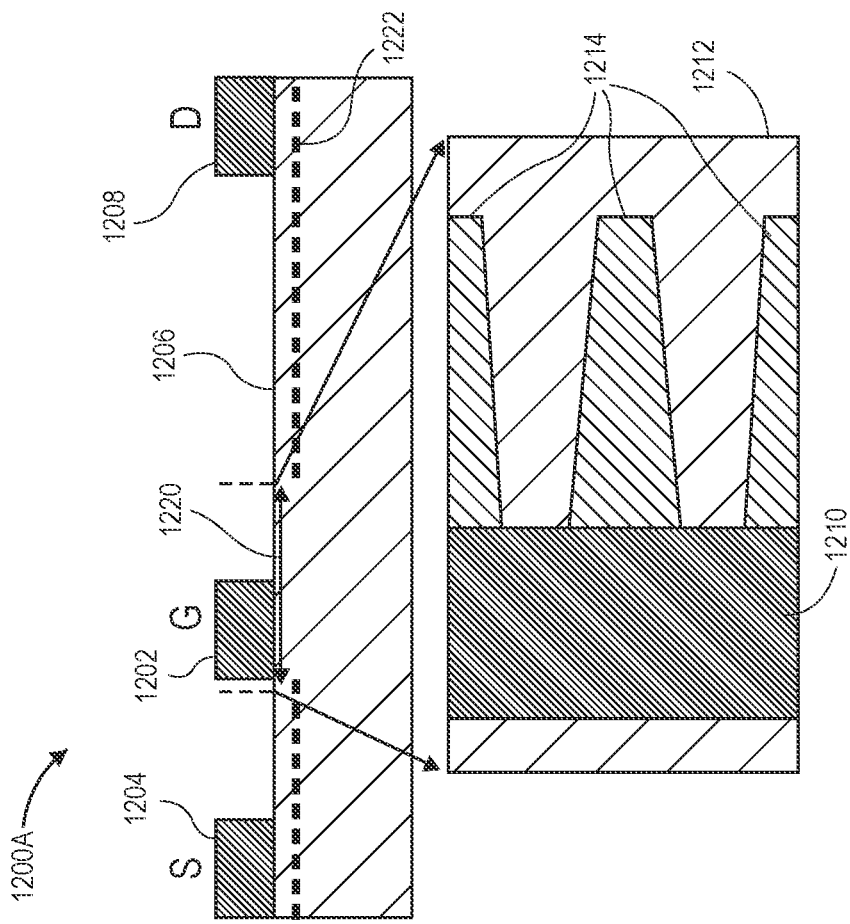
FIG. 12A shows a cross-sectional view and a plan view of a GaN transistor according to an embodiment of the disclosure.

FIG. 12A shows a cross-sectional view and a plan view of a GaN transistor 1200A according to an embodiment of the disclosure. In FIG. 12A, a cross-sectional view of GaN transistor 1200A with a source region 1204, gate region 1202, drift region 1206, drain region 1208 and a 2DEG layer 1222 is shown. A plan view of a zoomed-in section 1220 is also shown, where gate 1210, active region 1212 and charge controlled regions 1214 are shown. In this embodiment the charge controlled regions 1214 have a triangular or a trapezoidal shapes. The charge controlled regions 1214 can be P-type GaN, isolation implant and/or a combination of the P-type GaN and isolation implant structures. FIG. 12B shows 2DEG charge density and electric field as a function of location along the active region. As shown in FIG. 12B, 2DEG charge density 1227 is reduced proximate the gate region 1202 due to the presence of the charge controlled regions 1214. As a result of reduced charge density, electric field 1225 is reduced in a region proximate the gate region 1202 compared to the electric field for a case without charge control structures (1229). As appreciated by one of ordinary skill in the art having the benefit of this disclosure, charge control structures can be continuous structure and/or can be in shape of islands. Further, as appreciated by one of ordinary skill in the art, charge control structures can have varying sizes and spacings.

Figures 13A, 13B:
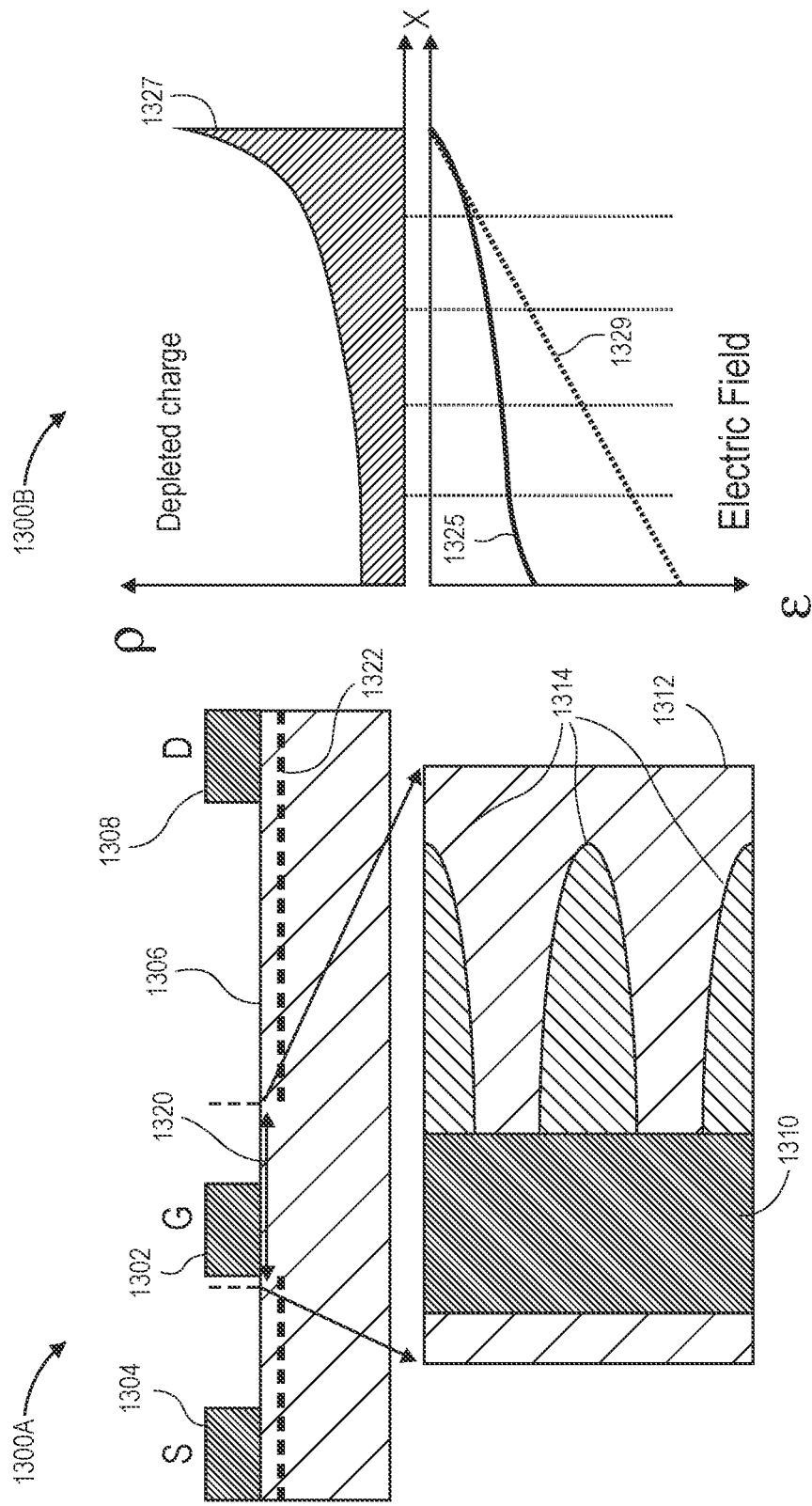
FIG. 13A shows a cross-sectional view and a plan view of a GaN transistor according to an embodiment of the disclosure.
FIG. 13B shows 2DEG charge density and electric field as a function of location along the active region for the GaN transistor of FIG. 13A.

FIG. 13A shows a cross-sectional view and a plan view of a GaN transistor 1300A according to an embodiment of the disclosure. In FIG. 13A, a cross-sectional view of GaN transistor with a source region 1304, gate region 1302, drift region 1306, drain region 1308 and a 2DEG layer 1322 is shown. A plan view of a zoomed-in section 1320 is also shown, where gate 1310, active region 1312 and charge controlled regions 1314 are shown. In this embodiment the charge control regions have an ellipsoidal shape. The charge control regions can be P-type GaN, isolation implant and/or a combination of the P-type GaN and isolation implant structures. FIG. 13B shows 2DEG charge density and electric field as a function of location along the active region. As shown in FIG. 13B, 2DEG charge density 1327 is reduced proximate the gate region 1302 due to the presence of the charge controlled regions 1314. As a result of reduced charge density, electric field 1325 is reduced in a region proximate the gate region 1302 compared to the electric field for a case without charge control structures (1329). As appreciated by one of ordinary skill in the art having the benefit of this disclosure, charge control structures can be continuous structure and/or can be in shape of islands. Further, as appreciated by one of ordinary skill in the art, charge control structures can have varying sizes and spacings.

Figure 14:
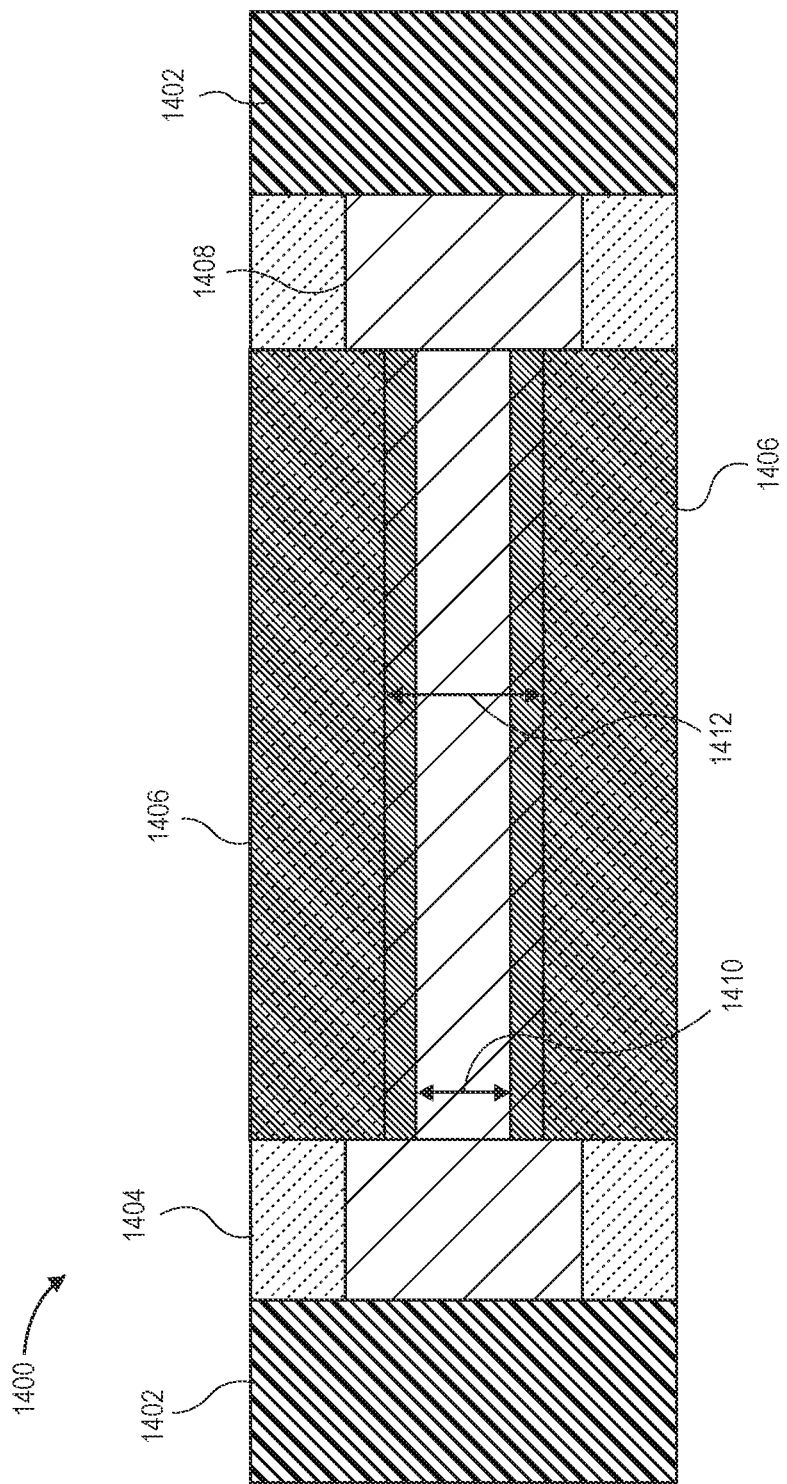
FIG. 14 shows a plan view a GaN resistor according to an embodiment of the disclosure.

FIG. 14 shows a plan view of a GaN resistor 1400 according to an embodiment of the disclosure. GaN resistor 1400 can include ohmic contact regions 1402, active region 1408, and isolation implanted regions 1404. In some embodiments the ohmic contact regions 1402 can be metallic contact regions. The active region 1408, which in this embodiment has a dog-bone shape, can enable formation of a 2DEG in the substrate, where a resistance value of the resistor can be set by a minimum manufacturing active region width 1412. A width of the minimum manufacturing active region width 1412 may be set by a minimum manufacturing spacing between the implanted regions 1404. In the illustrated embodiment, P-type GaN charge control structures 1406 can be added to the resistor in order to form a relatively high value resistor. The charge control structures can have a minimum manufacturing spacing 1410. A value of spacing 1410 can be lower than active region width 1412, thus enabling formation of a relatively high value resistor. In this way, manufacturing limitations on minimum spacing of implanted regions can be circumvented. Furthermore, this technique can allow the formation of relatively high value resistors without a need for costly and complex change in manufacturing equipment. Furthermore, the use of P-type GaN charge control structures can enable improved manufacturing control of the resistor value as compared to a resistor formed without charge control structures. For example, if a minimum manufacturing design rule is set at 10 nm for an active width, this technique can enable manufacturing of a resistor having a resistance value that can be equal to a resistance of a resistor having an active width of 8 nm. As appreciated by one of ordinary skill in the art having the benefit of this disclosure, the minimum manufacturing design rule for an active width and spacing can vary for various semiconductor manufacturing processes.

Figure 15:
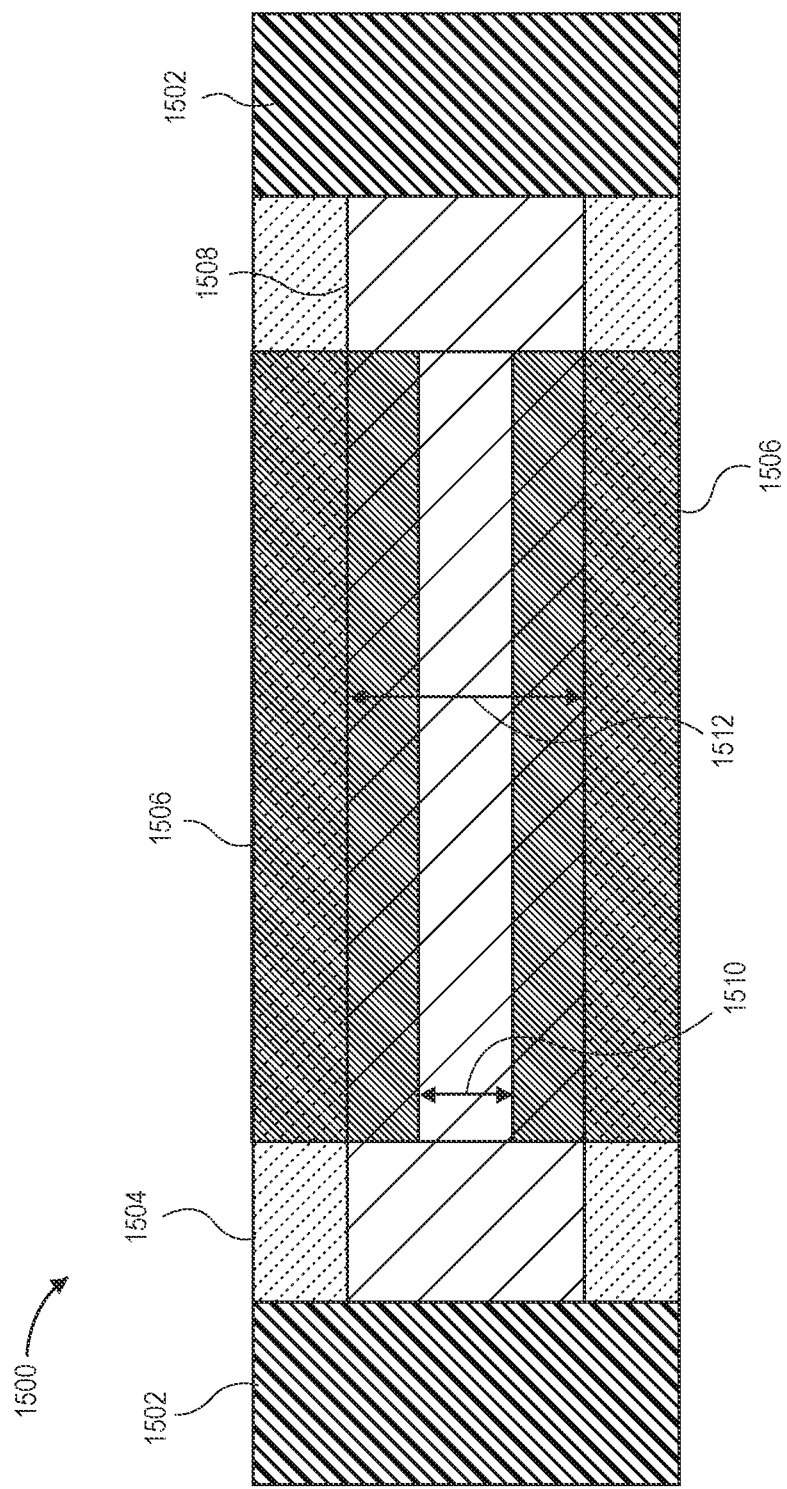
FIG. 15 shows a plan view a GaN resistor according to an embodiment of the disclosure.

FIG. 15 shows a plan view of a GaN resistor 1500 according to an embodiment of the disclosure. GaN resistor 1500 can include ohmic contact regions 1502, active region 1508, and isolation implanted regions 1504. In some embodiments the ohmic contact regions 1502 can be metallic contact regions. In the illustrated embodiment, the active region 1508 having a shape of a rectangle, can have a non-minimum manufacturing width of 1512. As understood by those skilled in the art, a non-minimum manufacturing feature size is a feature size which does not use a minimum feature size of the manufacturing process. P-type GaN charge control structures 1506 can be added to the resistor in order to form a relatively high value resistor. The charge control structures can have a minimum manufacturing spacing 1510. Thus, a relatively high value resistor can be formed even with a non-minimum width of the active region. Furthermore, the use of P-type GaN charge control structures can enable improved manufacturing controls in the value of the resistor as compared to a resistor formed without the charge control structure.

Figure 16:
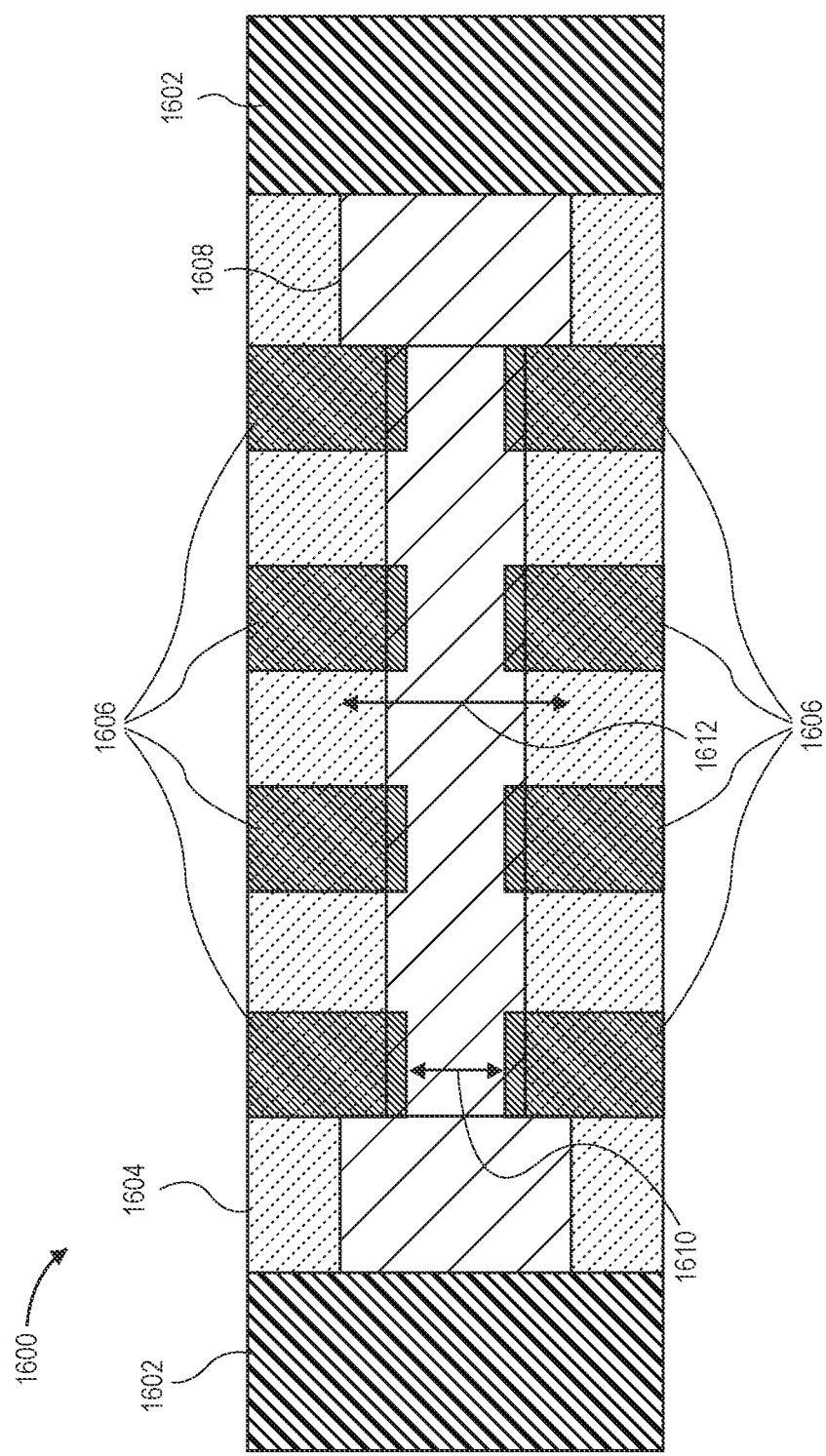
FIG. 16 shows a plan view a GaN resistor according to an embodiment of the disclosure.

FIG. 16 shows a plan view of a GaN resistor 1600 according to an embodiment of the disclosure. GaN resistor 1600 can include ohmic contact regions 1602, active region 1608, and isolation implanted regions 1604. In some embodiments the ohmic contact regions can be metallic contact regions. The active region, which can have dog-bone shape, can enable formation of 2DEG in the substrate, where a value of the resistor can be determined by a minimum manufacturing width of the active region 1612. A width of the minimum active region width 1612 may be set by a minimum manufacturing spacing between the implanted regions 1604. In the illustrated embodiment, P-type GaN charge control structures 1606 can be added to the resistor in order to form a relatively high value resistor. The P-type GaN structure can be in form of multiple islands. The charge control structures can have a minimum manufacturing spacing 1610. In some embodiments, spacing 1610 can be less than the minimum active region width 1612, thus enabling formation of a relatively high value resistor. In this way, manufacturing limitations on minimum spacing of implanted regions can be circumvented, and this technique can allow the formation of relatively high value resistors without a need for costly and complex changes in manufacturing equipment. Furthermore, the use of P-type GaN charge control structures can enable improved manufacturing control of the resistor value as compared to a resistor formed without charge control structures.

Figure 17:
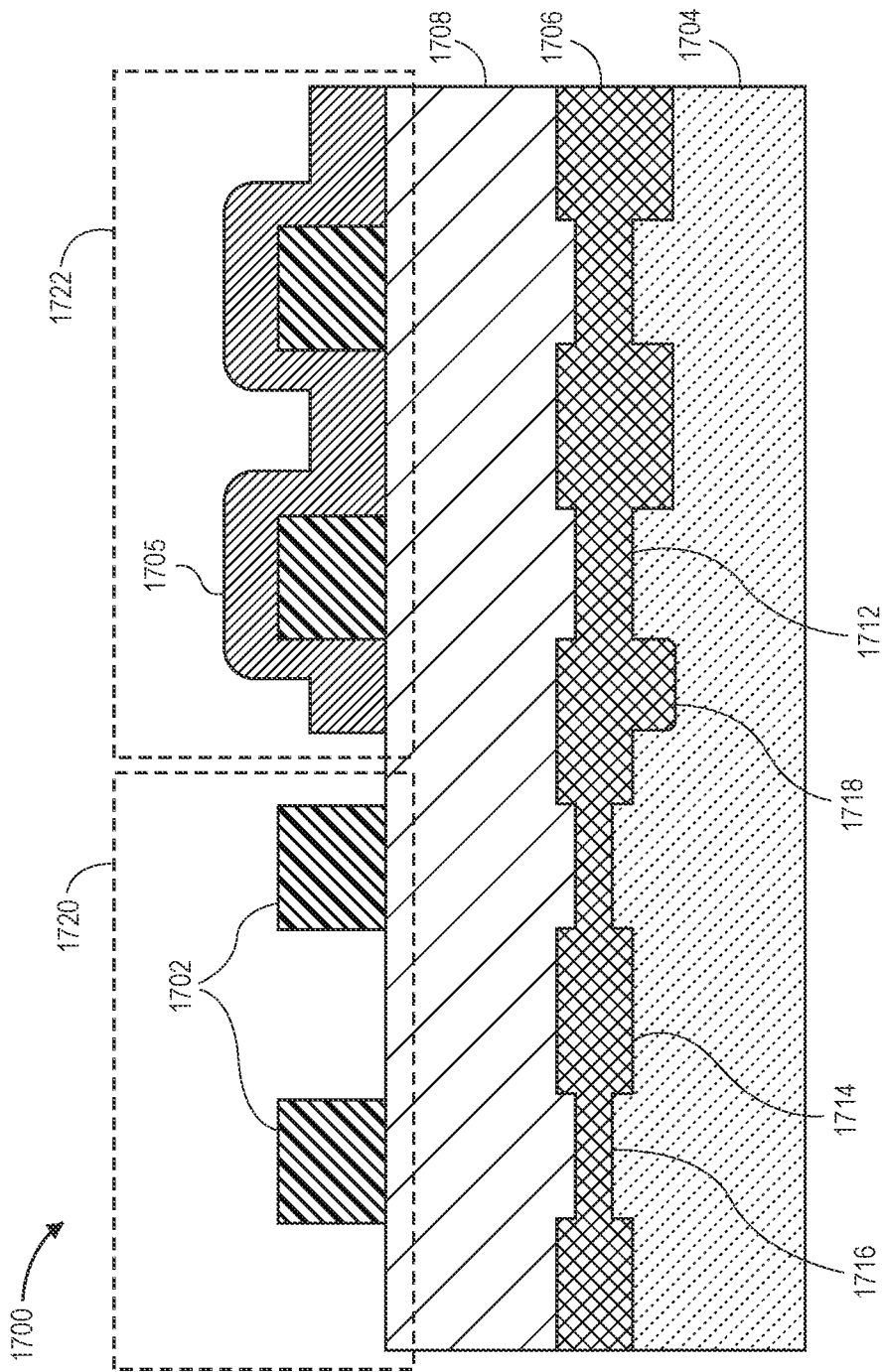
FIG. 17 shows a cross-sectional view of a GaN device with P-type GaN islands and an additional AlGaN layer according to an embodiment of the disclosure.

FIG. 17 illustrates a cross-sectional view of GaN device 1700. The GaN device 1700 can include a GaN layer 1704, a first AlGaN layer 1708, and a 2DEG layer 1706 formed between the GaN layer 1704 and the first AlGaN layer 1708. The GaN device 1700 can also include islands 1702. In some embodiments, the islands 1702 can be formed from P-type GaN material. The GaN device 1700 can further include a second AlGaN layer 1705 formed on the first AlGaN layer 1708. In the illustrated embodiment, the second AlGaN layer 1705 can be removed in some areas, such as in area 1720. As discussed above, the 2DEG charge density can be reduced under the P-type GaN islands 1702 (for example, location 1716) compared to regions with no P-type GaN islands (for example location 1714). The addition of second AlGaN layer 1705 on the first AlGaN layer 1708 in the area 1722 can increase the charge density in the 2DEG layer 1706 below the second AlGaN layer 1705 (for example location 1718). As before, the presence of P-type GaN islands in area 1722 can decrease the 2DEG charge density below the islands, for example, location 1712, however the 2DEG charge density in location 1712 can be higher than the 2DEG charge density in location 1716, due to the presence of the second AlGaN layer 1705 over the location 1712. Thus, this method can allow for control of the 2DEG charge density in various locations in a GaN substrate and/or GaN wafer.

An amount of 2DEG charge density increase due to presence of the second AlGaN layer 1705 can depend on a thickness of the second AlGaN layer 1705. In some embodiments, the thickness of the second AlGaN layer 1705 can be, for example, 50 nm. In various embodiments, the thickness of the second AlGaN layer 1705 can be, for example, 100 nm, while in other embodiments the thickness can be between 5 to 10 nm, and in yet other embodiments the thickness can be between 150 to 250 nm. As appreciated by one of ordinary skill in the art having the benefit of this disclosure, the thickness of the second AlGaN layer 1705 can be set to any suitable value. Further, as appreciated by one of ordinary skill in the art, the 2DEG charge density control technique described above can employ one or more islands, different sizes and shapes for each island, non-uniform spacing between each island and other characteristics that can be different than those described herein. Moreover, as appreciated by one of ordinary skill in the art, the P-type GaN layer can have varying values of doping densities. Furthermore, the second AlGaN layer 1705 may have varying concentrations of Al and GaN. Moreover, a third AlGaN layer can formed on the second AlGaN layer 1705 for controlling the 2DEG charge density. In some embodiments, a plurality of AlGaN layers can be used for the control of the 2DEG charge density.

Figure 18:
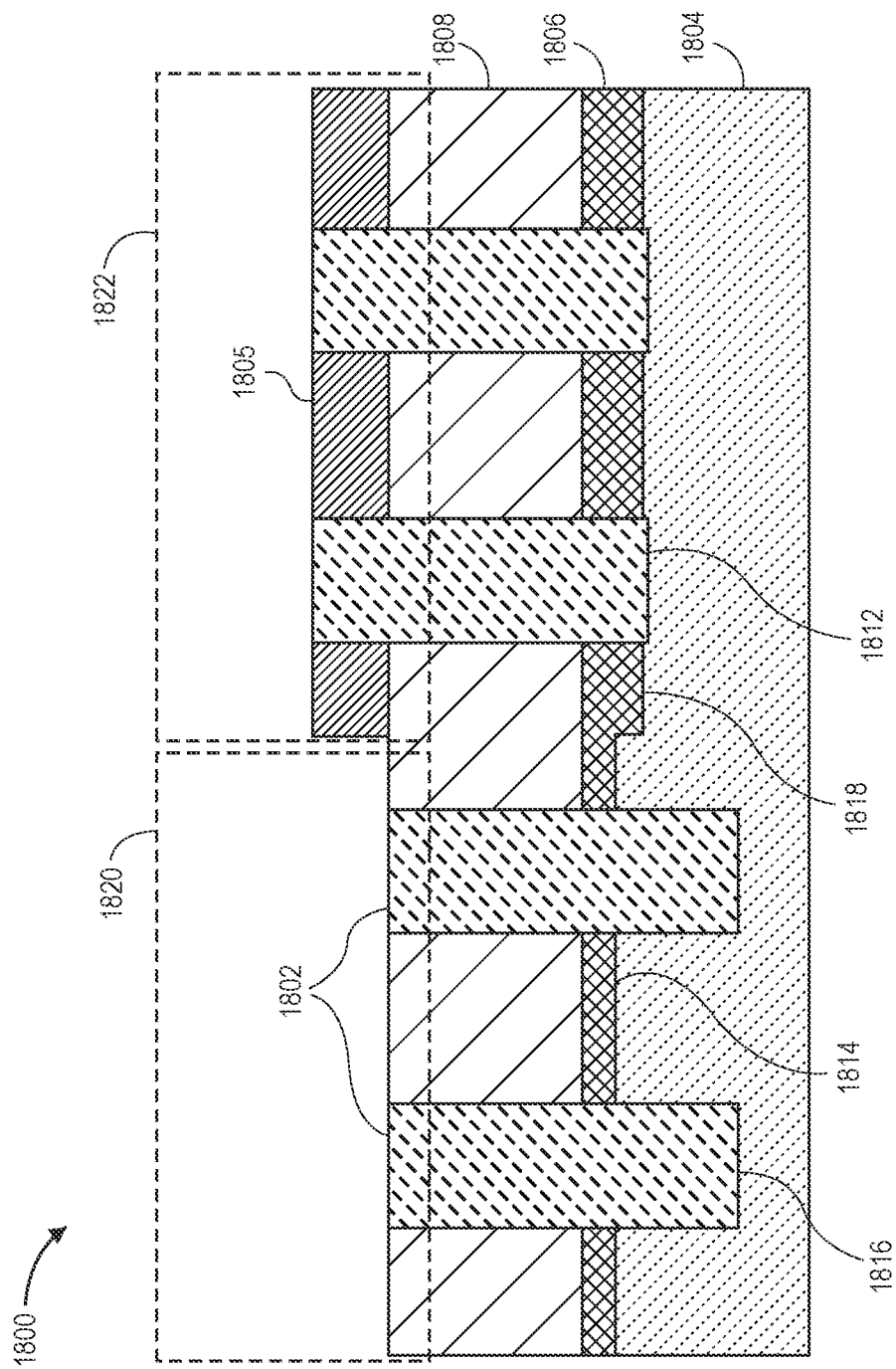
FIG. 18 shows a cross-sectional view of a GaN device with patterned isolation implantation and an additional AlGaN layer according to an embodiment of the disclosure.

FIG. 18 illustrates a cross-sectional view of a GaN device 1800 according to an embodiment of the disclosure. As shown in FIG. 18, GaN device 1800 can include a GaN layer 1804, a first AlGaN layer 1808 and a 2DEG layer 1806 formed between the GaN layer 1804 and the first AlGaN layer 1808. The GaN device 1800 can include isolation implanted regions 1802. The GaN device 1800 can further include a second AlGaN layer 1805 formed on the first AlGaN layer 1808. In the illustrated embodiment, the second AlGaN layer 1805 can be removed in some areas, such as in area 1820. As discussed above, isolation implant regions 1802 can be utilized in the GaN device 1800 where an isolation implant can be placed into the active regions of the GaN device 1800. The isolation implanted regions 1802 can produce damaged lattice structure in the underlying first AlGaN layer 1808 and GaN layer 1804, eliminating charge carriers in the 2DEG layer 1806. Further, the damaged lattice structures can reduce piezoelectric effects beyond the immediate implanted regions and can cause a reduction of charge carriers in the adjacent 2DEG regions. The addition of the second AlGaN layer 1805 on the first AlGaN layer 1808 in the area 1822 can increase the charge density in the 2DEG layer 1806 below the regions where the second AlGaN layer 1805 is present (for example location 1818). As before, the presence of isolation implanted regions 1802 can eliminated the 2DEG charge density in those regions, for example, location 1812.

Similar to the discussion above in FIGS. 2A and 2B, the 2DEG charge carriers can be eliminated where the isolation implanted regions 1802 are present, where isolation implants used for forming the isolation implanted regions 1802 can penetrate through the second AlGaN layer 1805 and the first AlGaN layer 1808. In some embodiments, the isolation implant may penetrate into the GaN layer 1804. The addition of the second AlGaN layer 1805 can increase the 2DEG charge density below the regions with the second AlGaN layer 1805. The amount of increase of 2DEG charge density can depend on a thickness of the second AlGaN layer 1805. In some embodiments, the thickness of the second AlGaN layer 1805 can be, for example, 50 nm. In various embodiments, the thickness of the second AlGaN layer 1805 can be, for example, 100 nm, while in other embodiments the thickness can be between 5 to 10 nm, and in yet other embodiments the thickness can be between 150 to 250 nm. As appreciated by one of ordinary skill in the art having the benefit of this disclosure, the thickness of the second AlGaN layer 1805 can be set to any suitable value. Further, as appreciated by one of ordinary skill in the art, the 2DEG charge density control technique described above can employ one or more isolation implanted regions, different sizes and shapes for each isolation implanted region, non-uniform spacing between each isolation implanted region and other characteristics that can be different than those described herein. Moreover, as appreciated by one of ordinary skill in the art, the isolation implanted regions can have varying values of depths. Furthermore, the second AlGaN layer 1805 may have varying concentrations of Al and GaN. Moreover, a third AlGaN layer can be formed on the second AlGaN layer 1805 for controlling the 2DEG charge density. In some embodiments, a plurality of AlGaN layers can be used for the control of the 2DEG charge density.

Figure 19:
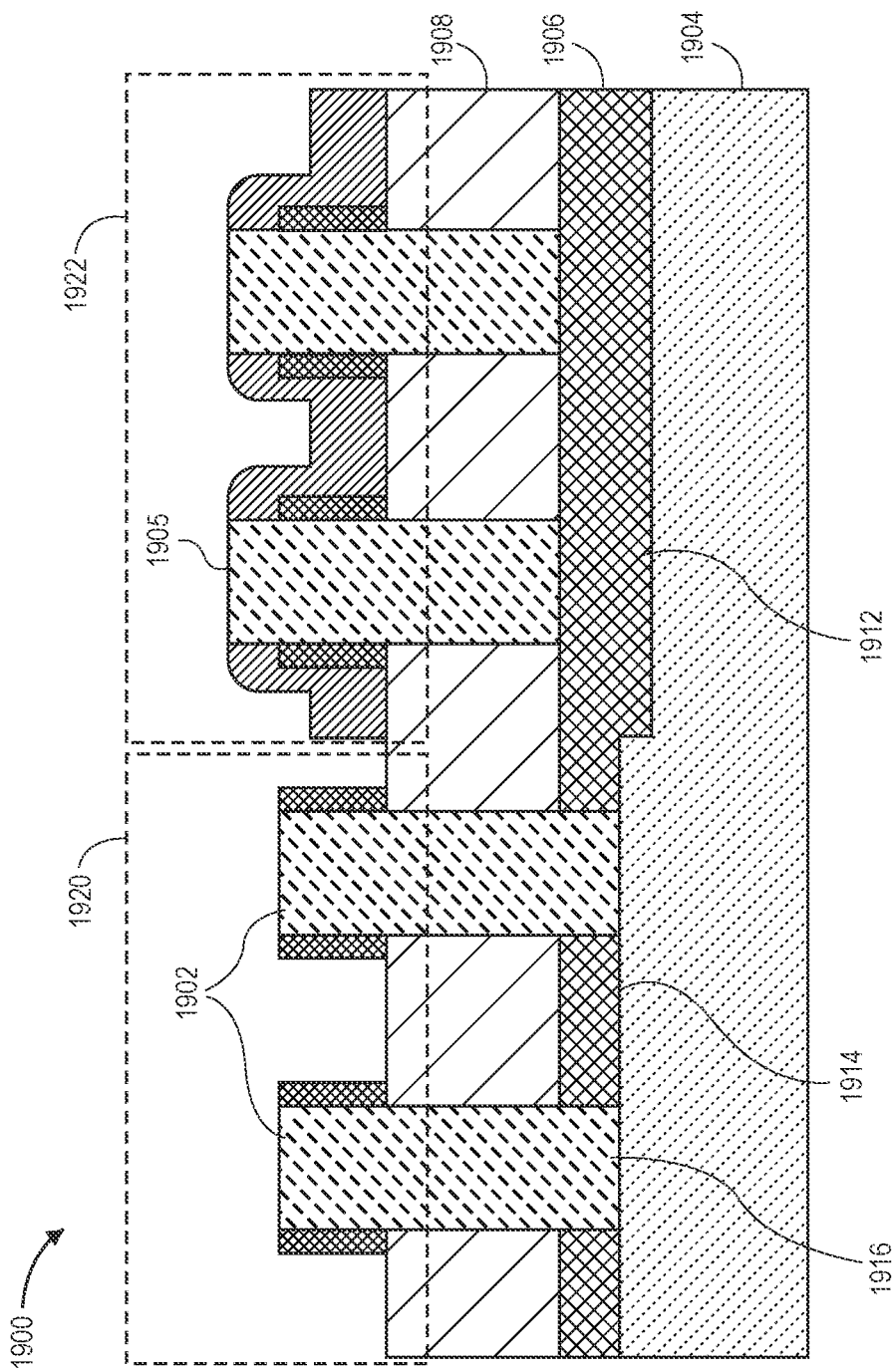
FIG. 19 shows a cross-sectional view of a GaN device with P-type GaN islands and patterned implantation, and an additional AlGaN layer according to an embodiment of the disclosure.

FIG. 19 illustrates a cross-sectional view of an embodiment of GaN device 1900 using isolation implanted regions through P-type GaN structures with a second AlGaN layer, according to an embodiment of the disclosure. As shown in FIG. 19, GaN device 1900 can include a GaN layer 1904, a first AlGaN layer 1908 and a 2DEG layer 1906 formed between the GaN layer 1904 and the first AlGaN layer 1908. The GaN device 1900 can include isolation implanted regions through P-type GaN structures 1902. The GaN device 1900 can further include a second AlGaN layer 1905 formed on the first AlGaN layer 1908. In the illustrated embodiment, the second AlGaN layer 1905 can be removed in some areas, such as in area 1920. Similar to the description above in FIGS. 3A and 3B, isolation implanted regions though P-type GaN structures 1902 can be formed by implanting through the P-type GaN structures. The isolation implanted regions through the P-type GaN structures 1902 can be utilized in active regions of GaN device 1900 to reduce the charge density in the 2DEG layer 1906. In the illustrated embodiment, due to presence of P-type GaN structures, the isolation implant can penetrate less into the substrate, thus the produced lattice structure damage may not completely eliminate the charge carriers in the 2DEG layer 1906. The addition of the second AlGaN layer 1905 on the first AlGaN layer 1908 in the area 1922 can increase the charge density in the 2DEG layer 1906 below the regions where the second AlGaN layer 1905 is present (for example location 1912).

The addition of the second AlGaN layer 1905 on the first AlGaN layer 1908 can increase the 2DEG charge density below the regions with the second AlGaN layer 1905. The amount of increase of 2DEG charge density can depend on a thickness of the second AlGaN layer 1905. In some embodiments, the thickness of the second AlGaN layer 1905 can be, for example, 50 nm. In various embodiments, the thickness of the second AlGaN layer 1905 can be, for example, 100 nm, while in other embodiments the thickness can be between 5 to 10 nm, and in yet other embodiments the thickness can be between 150 to 250 nm. As appreciated by one of ordinary skill in the art having the benefit of this disclosure, the thickness of the second AlGaN layer 1905 can be set to any suitable value. Further, as appreciated by one of ordinary skill in the art, the 2DEG charge density control technique described above can employ one or more isolation implanted regions through P-type GaN regions, different sizes and shapes for each region, non-uniform spacing between each region and other characteristics that can be different than those described herein. Moreover, as appreciated by one of ordinary skill in the art, the isolation implanted regions through P-type GaN regions can have varying values of depths. Furthermore, the second AlGaN layer 1905 may have varying concentrations of Al and GaN. Moreover, a third AlGaN layer can be formed on the second AlGaN layer 1905 for controlling the 2DEG charge density. In some embodiments, a plurality of AlGaN layers can be used for the control of the 2DEG charge density.

Although 2DEG charge control structures for GaN devices are described and illustrated herein with respect to one particular configuration of GaN device, embodiments of the disclosure are suitable for use with other configurations of GaN devices and non-GaN devices. For example, any semiconductor device can be used with embodiments of the disclosure. In some instances, embodiments of the disclosure are particularly well suited for use with silicon and other compound semiconductor devices.

For simplicity, various internal components, such as the details of the substrate, various dielectric and metal layers, contacts, other components of GaN transistor 100 (see FIG. 1) are not shown in the figures.

In the foregoing specification, embodiments of the disclosure have been described with reference to numerous specific details that can vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

Additionally, spatially relative terms, such as "bottom or "top" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface can then be oriented "above" other elements or features. The device can be otherwise oriented (e.g., rotated 90 degrees or at other orientations) and the spatially relative descriptors used herein interpreted accordingly.

Terms "and," "or," and "an/or," as used herein, may include a variety of meanings that also is expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, B, C, AB, AC, BC, AA, AAB, ABC, AABBCCC, etc.

Reference throughout this specification to "one example," "an example," "certain examples," or "exemplary implementation" means that a particular feature, structure, or characteristic described in connection with the feature and/or example may be included in at least one feature and/or example of claimed subject matter. Thus, the appearances of the phrase "in one example," "an example," "in certain examples," "in certain implementations," or other like phrases in various places throughout this specification are not necessarily all referring to the same feature, example, and/or limitation. Furthermore, the particular features, structures, or characteristics may be combined in one or more examples and/or features.

In the preceding detailed description, numerous specific details have been set forth to provide a thorough understanding of claimed subject matter. However, it will be understood by those skilled in the art that claimed subject matter may be practiced without these specific details. In other instances, methods and apparatuses that would be known by one of ordinary skill have not been described in detail so as not to obscure claimed subject matter. Therefore, it is intended that claimed subject matter not be limited to the particular examples disclosed, but that such claimed subject matter may also include all aspects falling within the scope of appended claims, and equivalents thereof.

What is claimed is:

1. A gallium nitride (GaN) device comprising:
a compound semiconductor substrate;
a source region formed in the compound semiconductor substrate;
a drain region formed in the compound semiconductor substrate and separated from the source region;
a two-dimensional electron gas (2DEG) layer formed in the compound semiconductor substrate and extending between the source region and the drain region;
a gate region formed on the compound semiconductor substrate and positioned between the source region and the drain region; and
a plurality of isolated charge control structures disposed between the gate region and the drain region; and
wherein the plurality of isolated charge control structures are not in direct contact with the gate region.

2. The GaN device of claim 1, wherein each of the plurality of isolated charge control structures are arranged to selectively reduce a charge density in the 2DEG layer under each of the plurality of isolated charge control structures.

3. The GaN device of claim 1, wherein each of the plurality of isolated charge control structures is disposed on the compound semiconductor substrate.

4. The GaN device of claim 3, wherein each of the plurality of isolated charge control structures comprises a GaN layer.

5. The GaN device of claim 4, wherein the GaN layer comprises a P-type GaN layer.

6. The GaN device of claim 1, wherein each of the plurality of isolated charge control structures is disposed within the compound semiconductor substrate.

7. The GaN device of claim 6, wherein each of the plurality of isolated charge control structures comprises an isolation implanted region.

8. The GaN device of claim 5, wherein each of the plurality of isolated charge control structures comprises an isolation implanted region formed through the P-type GaN layer.

9. The GaN device of claim 1, wherein each of the plurality of isolated charge control structures are formed in shape of an island.

10. The GaN device of claim 1, wherein the plurality of isolated charge control structures are disposed proximal to the gate region.

11. The GaN device of claim 10, wherein the plurality of isolated charge control structures are arranged to reduce an electric field proximal to the gate region.

12. The GaN device of claim 9, wherein a pattern density of the plurality of isolated charge control structures is constant in regions proximal to the gate region and regions proximal to the drain region.

13. The GaN device of claim 1, wherein each of the plurality of isolated charge control structures are formed in shape of a trapezoid extending from the gate region towards the drain region.

14. The GaN device of claim 4, wherein each of the plurality of isolated charge control structures are formed in shape of an ellipse extending from the gate region towards the drain region.

15. A method of controlling a charge density in a two-dimensional electron gas (2DEG) layer in a gallium nitride (GaN) device, the method comprising:
providing a compound semiconductor substrate comprising a first layer and a second layer, and further comprising a 2DEG layer formed between the first layer and the second layer;
forming an active region;
forming a gate region on the compound semiconductor substrate and across the active region; and
forming a plurality of isolated charge control structures on the active region, wherein each of the plurality of isolated charge control structures are arranged to selectively reduce a charge density in the 2DEG layer under each of the plurality of isolated charge control structures; and
wherein the plurality of isolated charge control structures are not in direct contact with the gate region.

16. The method of claim 15, wherein each of the plurality of isolated charge control structures comprises a P-type GaN layer.

17. The method of claim 15, wherein each of the plurality of isolated charge control structures comprises an isolation implanted region.

18. A gallium nitride (GaN) device comprising:
a compound semiconductor substrate;
a two-dimensional electron gas (2DEG) layer formed in the compound semiconductor substrate;
a resistor formed in the compound semiconductor substrate, the resistor comprising an active region, and a first and second ohmic contacts; and
a plurality of isolated charge control structures formed on at least a portion of the active region, wherein each of the plurality of isolated charge control structures is arranged to reduce a charge density in the 2DEG layer under each of the plurality of isolated charge control structures thereby causing an increase in a resistance of the resistor; and
wherein a spacing between each adjacent charge control structure is lower than a minimum manufacturing width for the active region.

19. The GaN device of claim 18, wherein each of the plurality of isolated charge control structures comprises a P-type GaN layer.

* * * * *